(12) United States Patent
Suzuki et al.

(10) Patent No.: US 10,629,806 B2
(45) Date of Patent: Apr. 21, 2020

(54) MAGNETORESISTANCE EFFECT DEVICE AND MAGNETORESISTANCE EFFECT MODULE

(71) Applicant: TDK CORPORATION, Tokyo (JP)

(72) Inventors: Tsuyoshi Suzuki, Tokyo (JP); Shinji Hara, Tokyo (JP); Atsushi Shimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/262,513

(22) Filed: Jan. 30, 2019

(65) Prior Publication Data

US 2019/0237663 A1 Aug. 1, 2019

(30) Foreign Application Priority Data

Feb. 1, 2018 (JP) .................................. 2018-016683
Dec. 11, 2018 (JP) .................................. 2018-231753

(51) Int. Cl.
*H01L 43/08* (2006.01)
*H03B 15/00* (2006.01)
(Continued)

(52) U.S. Cl.
CPC .............. *H01L 43/08* (2013.01); *H01L 27/22* (2013.01); *H01L 43/02* (2013.01); *H03B 15/006* (2013.01);
(Continued)

(58) Field of Classification Search
CPC ......... H01L 43/08; H01L 43/02; H01L 27/22; H03H 1/0007; H03H 2/00;
(Continued)

(56) References Cited

U.S. PATENT DOCUMENTS

2016/0277000 A1 9/2016 Shibata et al.
2017/0244377 A1 8/2017 Yamane et al.
(Continued)

FOREIGN PATENT DOCUMENTS

JP 2017-063397 A 3/2017
WO 2007/032149 A1 3/2007

OTHER PUBLICATIONS

Konishi, K. et al., "Radio-Frequency Amplification Property of the MGO-Based Magnetic Tunnel Junction Using Field-Induced Ferromagnetic Resonance", Appl. Phys. Lett., vol. 102, pp. 162409-1-162409-4, (2013).

*Primary Examiner* — Seahvosh Nikmanesh
(74) *Attorney, Agent, or Firm* — Oliff PLC

(57) ABSTRACT

The magnetoresistance effect device includes first and second ports, a first circuit unit and a second circuit unit connected between the first port and the second port, a shared reference electric potential terminal or a first reference electric potential terminal and a second reference electric potential terminal, and a shared DC application terminal or a first DC application terminal and a second DC application terminal, the first circuit unit includes a first magnetoresistance effect element, the second circuit unit includes a second magnetoresistance effect element and a first conductor separated from the second magnetoresistance effect element with an insulating body therebetween and a first end portion of the first conductor is connected to an input side of high frequency current such that high frequency magnetic field generated by the high frequency current flowing through the first conductor is applied to the magnetization free layer of the second magnetoresistance effect element.

6 Claims, 20 Drawing Sheets

(51) Int. Cl.
  *H03H 1/00* (2006.01)
  *H01L 27/22* (2006.01)
  *H01L 43/02* (2006.01)
  *H03H 2/00* (2006.01)
(52) U.S. Cl.
  CPC ............ *H03H 1/0007* (2013.01); *H03H 2/00* (2013.01); *H03H 2001/0057* (2013.01); *H03H 2001/0085* (2013.01)
(58) Field of Classification Search
  CPC ... H03H 2001/0057; H03H 2001/0085; H03B 15/006
  See application file for complete search history.

(56) References Cited

U.S. PATENT DOCUMENTS

2018/0040666 A1  2/2018  Shibata et al.
2018/0316077 A1* 11/2018 Yamane .................. H01P 1/218

* cited by examiner

MAGNETORESISTANCE EFFECT DEVICE AND MAGNETORESISTANCE EFFECT MODULE

CROSS-REFERENCE TO RELATED APPLICATION

Priority is claimed on Japanese Patent Application No. 2018-016683 filed in Japan on Feb. 1, 2018 and Japanese Patent Application No. 2018-231753 filed in Japan on Dec. 11, 2018, the contents of which are incorporated herein by reference.

BACKGROUND

The present disclosure relates to a magnetoresistance effect device and a magnetoresistance effect module.

In recent years, with the advancement in functions of a mobile communication terminal such as a cellular phone or the like, a speed of wireless communication has increased. Since the communication speed is in proportion to a bandwidth of a frequency in use, a frequency band required for communication has increased. Accordingly, the number of mounted high-frequency filters required for a mobile communication terminal has also increased.

In recent years, a field researched as having a probability of application in novel parts for high frequencies has been spintronics. One of phenomena attracting attention regarding this is a ferromagnetic resonance phenomenon of a magnetoresistance effect element.

When an alternating current or an alternating magnetic field is applied to a ferromagnetic layer included in a magnetoresistance effect element, ferromagnetic resonance can occur in magnetization of a ferromagnetic layer. When ferromagnetic resonance occurs, a resistance value of the magnetoresistance effect element periodically oscillates at a ferromagnetic resonance frequency. The ferromagnetic resonance frequency of the resistance value varies according to the intensity of the magnetic field applied to the ferromagnetic layer, and in general, the ferromagnetic resonance frequency is within a high frequency band of several to tens of GHz.

For example, Japanese Unexamined Patent Application, First Publication No. 2017-063397 discloses a magnetoresistance effect device that can be used as a high frequency device such as a high-frequency filter or the like using a ferromagnetic resonance phenomenon.

SUMMARY

However, in a high-frequency filter using a magnetoresistance effect device, frequency characteristics (steepness characteristics) in the vicinity of a cutoff frequency may not be sufficient.

It is desirable to provide a magnetoresistance effect device having good frequency characteristics in the vicinity of a cutoff frequency.

The inventors has found that when circuit units (elements) showing predetermined characteristics are combined, the characteristics thereof overlap each other, and steepness characteristics of a magnetoresistance effect device can be improved, thus solving these problems.

That is, the present disclosure provides the following means.

(1) A magnetoresistance effect device including: a first port; a second port; a first circuit unit and a second circuit unit connected between the first port and the second port; a shared reference electric potential terminal connected to both of the first circuit unit and the second circuit unit, or a first reference electric potential terminal and a second reference electric potential terminal, each of which is connected to the first circuit unit and the second circuit unit, respectively; and a shared DC application terminal configured to be capable of connecting a power supply for applying a DC current or a DC voltage to both of a first magnetoresistance effect element of the first circuit unit and a second magnetoresistance effect element of the second circuit unit, or a first DC application terminal and a second DC application terminal, each of which is configured to be capable of connecting a power supply for applying a DC current or a DC voltage to a first magnetoresistance effect element of the first circuit unit and a second magnetoresistance effect element of the second circuit unit, respectively, wherein the first circuit unit includes the first magnetoresistance effect element including a magnetization fixed layer, a magnetization free layer, and a spacer layer interposed therebetween, one end of the first magnetoresistance effect element is connected to an input side of a high frequency current in the first circuit unit, and the other end of the first magnetoresistance effect element is connected to an output side of the high frequency current in the first circuit unit, the second circuit unit includes the second magnetoresistance effect element including a magnetization fixed layer, a magnetization free layer, and a spacer layer interposed therebetween, and a first conductor disposed to be separated from the second magnetoresistance effect element with an insulating body therebetween and a first end portion of the first conductor is connected to an input side of a high frequency current such that a high frequency magnetic field generated by the high frequency current flowing through the first conductor is applied to the magnetization free layer of the second magnetoresistance effect element.

DETAILED DESCRIPTION

Figure 1:
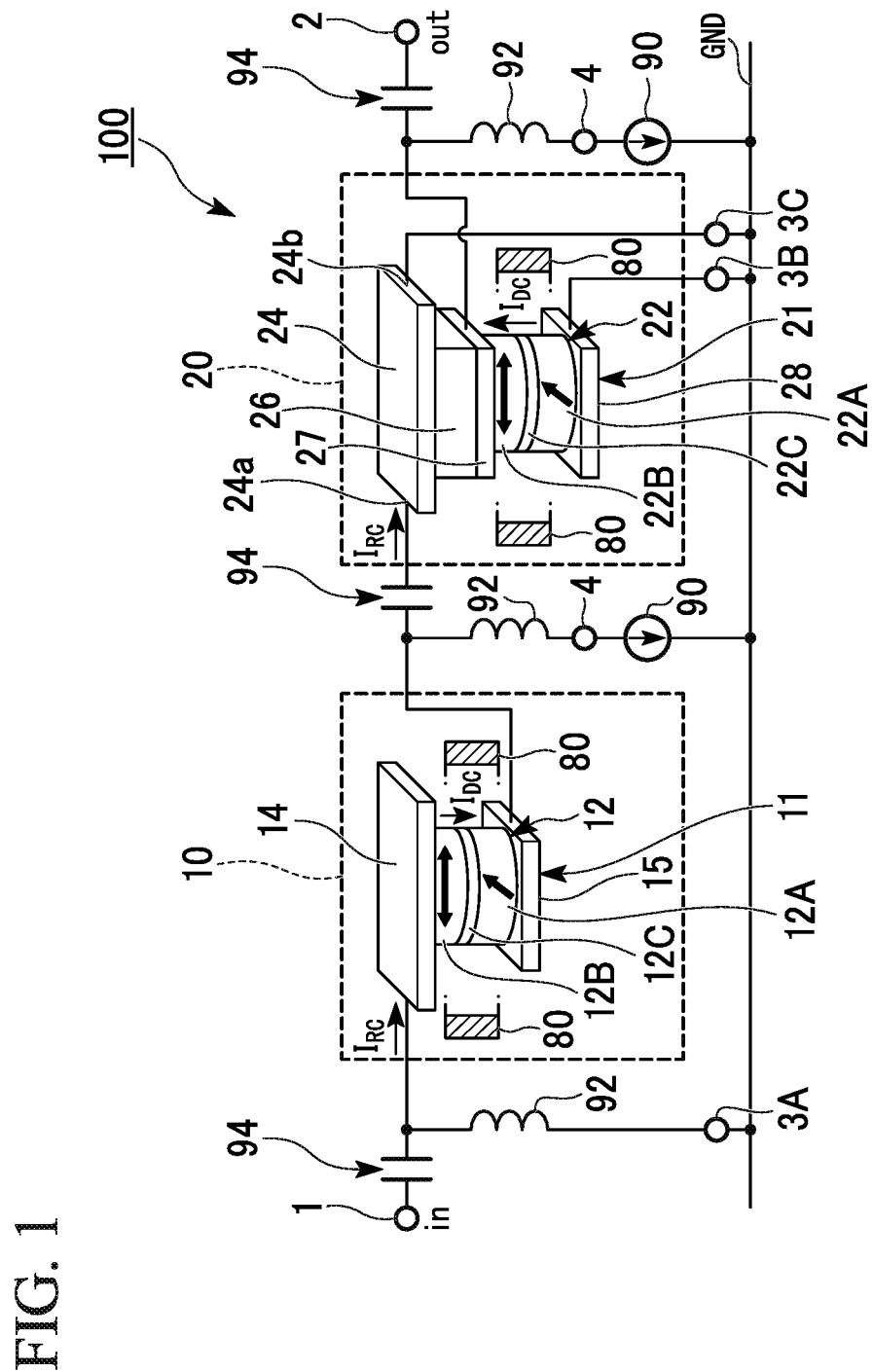
FIG. 1 is a schematic view showing a circuit configuration of a magnetoresistance effect module according to a first embodiment.

Hereinafter, a magnetoresistance effect module will be described in detail with reference to the accompanying drawings. In the drawings used in the following description, in order to make features easier to understand, there are cases where characteristics parts are shown in enlarged forms for convenience, and dimensional proportions of components may be different from actual ones. The materials, dimensions, and the like, exemplified in the following description are merely examples, and the present invention is not limited thereto and can be appropriately changed and realized within a range in which effects of the present invention are achieved.

First Embodiment

FIG. 1 is a schematic view showing a circuit configuration of a magnetoresistance effect module according to a first embodiment. The magnetoresistance effect device includes a first port 1, a second port 2, a first circuit unit 10, a second circuit unit 20, reference electric potential terminals 3A, 3B and 3C, and a DC application terminal 4. A magnetoresistance effect module 100 is configured by connecting a power supply 90 to the DC application terminal 4. In the magnetoresistance effect module 100, a signal is input from the first port 1, and a signal is output from the second port 2.

<First Port and Second Port>

The first port 1 is an input terminal of the magnetoresistance effect module 100. Since an alternating current signal source (not shown) is connected to the first port 1, an alternating current signal (a high frequency signal) can be applied to the magnetoresistance effect module 100. The high frequency signal applied to the magnetoresistance effect module 100 is a signal having a frequency of, for example, 100 MHz or more.

The second port 2 is an output terminal of the magnetoresistance effect module 100.

<First Circuit Unit>

The first circuit unit 10 is connected between the first port 1 and the second port 2. A series type current driven element 11 is assembled to the first circuit unit 10.

The current driven element 11 includes a first magnetoresistance effect element 12. One end of the first magnetoresistance effect element 12 in a laminating direction is connected to an input side of a high frequency current $I_{RC}$ in the first circuit unit 10, the other end of the first magnetoresistance effect element 12 in the laminating direction is connected to an output side of the high frequency current $I_{RC}$ in the first circuit unit 10, and the high frequency current $I_{RC}$ flows through the first magnetoresistance effect element 12. In the current driven element 11, since a first electrode 14 of the one end of the first magnetoresistance effect element 12 in the laminating direction is connected to the reference electric potential terminal 3A via an inductor 92, the high frequency current $I_{RC}$ flows through the first magnetoresistance effect element 12 without being branched off to the reference electric potential terminal 3A side.

<Magneto-Resistive Effect Element>

The first magnetoresistance effect element 12 has a magnetization fixed layer 12A, a magnetization free layer 12B and a spacer layer 12C. The first electrode 14 is provided on the one end of the first magnetoresistance effect element 12 in the laminating direction, and a counter electrode 15 is provided on the other end in the laminating direction. The first electrode 14 and the counter electrode 15 function as electrodes provided in the laminating direction of the first magnetoresistance effect element 12. The first electrode 14 and the counter electrode 15 are formed of a material having conductivity. For example, Ta, Cu, Au, AuCu, Ru, Al, or the like, may be used for the first electrode 14 and the counter electrode 15. The spacer layer 12C is disposed between the magnetization fixed layer 12A and the magnetization free layer 12B. The magnetization of the magnetization fixed layer 12A is fixed to one direction under a predetermined magnetic field environment while being harder to be moved than the magnetization of the magnetization free layer 12B. Since a direction of the magnetization of the magnetization free layer 12B is relatively variable with respect to a direction of the magnetization of the magnetization fixed layer 12A, the first magnetoresistance effect element 12 functions.

The magnetization fixed layer 12A is formed of a ferromagnetic material. The magnetization fixed layer 12A is preferably formed of a high spin polarization material such as Fe, Co, Ni, an alloy of Ni and Fe, an alloy of Fe and Co, an alloy of Fe, Co and B, or the like. A magnetoresistance change ratio of the first magnetoresistance effect element 12 is increased using these materials. In addition, the magnetization fixed layer 12A may be formed of a Heusler alloy. A film thickness of the magnetization fixed layer 12A is preferably 1 to 20 nm.

A magnetization fixing method of the magnetization fixed layer 12A is not particularly limited. For example, an antiferromagnetic layer may be added to come in contact with the magnetization fixed layer 12A to fix the magnetization of the magnetization fixed layer 12A. In addition, the magnetization of the magnetization fixed layer 12A may be fixed using magnetic anisotropy due to a crystallization structure, a shape, or the like. FeO, CoO, NiO, $CuFeS_2$, IrMn, FeMn, PtMn, Cr, Mn, or the like, may be used for an antiferromagnetic layer.

The magnetization free layer 12B is formed of a ferromagnetic material having a direction of magnetization that can be varied by an externally applied magnetic field or a spin polarization current.

CoFe, CoFeB, CoFeSi, CoMnGe, CoMnSi, CoMnAl, FeB, Co, a CoCr-based alloy, a Co multi-layered film, a CoCrPt-based alloy, a FePt-based alloy, a SmCo-based alloy including a rare earth element, a TbFeCo alloy, or the like, may be used as a material of the magnetization free layer 12B. In addition, the magnetization free layer 12B may be formed of a Heusler alloy.

A thickness of the magnetization free layer 12B is preferably about 0.5 to 20 nm. In addition, a high spin polarization material may be inserted between the magnetization free layer 12B and the spacer layer 12C. A high magnetoresistance change ratio can be obtained by inserting the high spin polarization material.

A CoFe alloy, a CoFeB alloy, or the like, may be exemplified as the high spin polarization material. A film thickness of either the CoFe alloy or the CoFeB alloy is preferably about 0.2 to 1.0 nm.

The spacer layer 12C is a layer disposed between the magnetization fixed layer 12A and the magnetization free layer 12B (a layer interposed therebetween). The spacer layer 12C is constituted by a layer formed of a conductor, an insulating body or a semi-conductor, or a layer including an electrical conduction point formed of the conductor in the insulating body. The spacer layer 12C is preferably a nonmagnetic layer.

For example, the first magnetoresistance effect element 12 is a tunneling magnetoresistance (TMR) effect element when the spacer layer 12C is formed of an insulating body, and is a giant magnetoresistance (GMR) effect element when the spacer layer 12C is formed of a metal.

When an insulating material is applied for the spacer layer 12C, an insulating material such as $Al_2O_3$, MgO, $MgAl_2O_4$, or the like, may be used. A high magnetoresistance change ratio is obtained by adjusting a film thickness of the spacer layer 12C such that a coherent tunnel effect is developed between the magnetization fixed layer 12A and the magnetization free layer 12B. In order to efficiently use the TMR effect, a film thickness of the spacer layer 12C is preferably about 0.5 to 3.0 nm.

When the spacer layer 12C is formed of a conductive material, a conductive material such as Cu, Ag, Au, Ru, or the like, may be used. In order to more efficiently use the GMR effect, a film thickness of the spacer layer 12C is preferably about 0.5 to 3.0 nm.

When the spacer layer 12C is formed of a semi-conductive material, a material such as ZnO, $In_2O_3$, $SnO_2$, ITO, $GaO_x$, $Ga_2O_x$, or the like, may be used. In this case, a film thickness of the spacer layer 12C is preferably about 1.0 to 4.0 nm.

When a layer including an electrical conduction point constituted by a conductor in a nonmagnetic insulating body is applied as the spacer layer 12C, a structure including an electrical conduction point constituted by a conductor such as CoFe, CoFeB, CoFeSi, CoMnGe, CoMnSi, CoMnAl, Fe, Co, Au, Cu, Al, Mg, or the like, in a nonmagnetic insulating body formed of $Al_2O_3$, MgO, or the like, may be provided. In this case, a film thickness of the spacer layer 12C is preferably about 0.5 to 2.0 nm.

A cap layer may be provided at a side of the magnetization free layer 12B opposite to the spacer layer 12C (between the magnetization free layer 12B and the first electrode 14). The magnetization free layer 12B and the cap layer may come in contact with each other. In addition, a seed layer or a buffer layer may be disposed between the first magnetoresistance effect element 12 and the counter electrode 15. A metal film such as Ru, Ta, Cu, Cr, or the like, an oxide film such as MgO or the like, a laminated film thereof, or the like, may be exemplified as the cap layer, the seed layer or the buffer layer. When the layer thereof is formed of an oxide film, a layer thickness thereof is thin such that current can flow. For example, the layer preferably has a thickness such that current (including a tunnel current) flows when a voltage of 3 V is applied to the first magnetoresistance effect element 12 in the laminating direction, and specifically, is preferably 5 nm or less.

In addition, a size of the first magnetoresistance effect element 12 is desirably 250 nm or less at a long side of a shape of the first magnetoresistance effect element 12 when seen in a plan view. In addition, a short side of the shape of the first magnetoresistance effect element 12 when seen in a plan view is desirably 20 nm or more. In the case of the current driven element 11, a size of the first magnetoresistance effect element 12 is preferably small. In the case in which the size of the first magnetoresistance effect element 12 is small, an effect of a spin transfer torque is increased and a ferromagnetic resonance phenomenon having a high efficiency is obtained. An area of the shape of the first magnetoresistance effect element 12 when seen in a plan view is preferably smaller than an area of a shape of a second magnetoresistance effect element 22 when seen in a plan view, which will be described below.

Further, when the shape of the first magnetoresistance effect element 12 when seen in a plan view is not a rectangular shape (including a square shape), a long side of a rectangular shape circumscribed by a minimum area of the shape of the first magnetoresistance effect element 12 when seen in a plan view is defined as a long side of the shape of the first magnetoresistance effect element 12 when seen in a plan view, and a short side of a rectangular shape circumscribed by a minimum area of the shape of the first magnetoresistance effect element 12 when seen in a plan view is defined as a short side of the shape of the first magnetoresistance effect element 12 when seen in a plan view.

Here, "the shape when seen in a plan view" is a shape when seen from a laminating direction of layers that constitute the first magnetoresistance effect element 12.

<Second Circuit Unit>

The second circuit unit 20 is connected between the first port 1 and the second port 2. While the second circuit unit 20 in FIG. 1 is connected between the first circuit unit 10 and the second port 2, and the first circuit unit 10 and the second circuit unit 20 are serially connected to each other, the second circuit unit 20 may be connected between the first port 1 and the first circuit unit 10. A magnetic field driving element 21 is assembled to the second circuit unit 20. The magnetic field driving element 21 includes the second magnetoresistance effect element 22 and a first conductor 24.

Here, as a material of the first conductor 24, for example, the same materials as exemplified for the first electrode 14 can be used.

The second magnetoresistance effect element 22 has a magnetization fixed layer 22A, a magnetization free layer 22B and a spacer layer 22C. A first electrode 27 is provided on one end of the second magnetoresistance effect element 22 in the laminating direction, and a counter electrode 28 is provided on the other end in the laminating direction. The second magnetoresistance effect element 22 is connected to the DC application terminal 4 that can connect the power supply 90 configured to apply a DC current or a DC voltage to the second magnetoresistance effect element 22.

The first conductor 24 is disposed to be separated from the second magnetoresistance effect element 22 via an insulating body 26 interposed therebetween. The insulating body 26 is thick such that insulation between the first conductor 24 and the first electrode 27 can be maintained. For example, the insulating body 26 preferably has a thickness such that current (including a tunnel current) does not flow when a voltage of 4.5 V is applied to the second magnetoresistance effect element 22 in the laminating direction, and specifically, is preferably 10 nm or more. A first end portion 24a of the first conductor 24 is connected to an input side of the high frequency current $I_{RC}$ in the second circuit unit 20. A second end portion 24b of the first conductor 24 is connected to the reference electric potential terminal 3C and connected to a reference electric potential via the reference electric potential terminal 3C. In the example of FIG. 1, the high frequency current $I_{RC}$ output from the first circuit unit 10 is input to the second circuit unit 20. A high frequency magnetic field is generated as the high frequency current $I_{RC}$ flows to the first conductor 24, and the generated high frequency magnetic field is applied to the magnetization free layer 22B of the second magnetoresistance effect element 22. Since the high frequency magnetic field is efficiently applied to the magnetization free layer 22B of the second magnetoresistance effect element 22, a thickness of the insulating body 26 is preferably 1,000 nm or less.

A size of the second magnetoresistance effect element 22 is desirably 500 nm or less at a long side of a shape of the second magnetoresistance effect element 22 when seen in a plan view. In addition, a short side of the shape of the second magnetoresistance effect element 22 when seen in a plan view is desirably 50 nm or more. When the long side is reduced to 500 nm or less, a volume of the magnetization free layer 22B is reduced, and a ferromagnetic resonance phenomenon having a high efficiency can be realized.

<Reference Electric Potential Terminal>

The reference electric potential terminals 3A, 3B and 3C are connected directly or indirectly to each of the first circuit unit 10 and the second circuit unit 20. The reference electric potential terminals 3A, 3B and 3C are connected to a reference electric potential, and determine a reference electric potential of the magnetoresistance effect module 100. In FIG. 1, they are connected to a ground GND serving as a reference electric potential. The ground GND is provided outside the magnetoresistance effect module 100. The high frequency current $I_{RC}$ input to the first port 1 flows through the first circuit unit 10 and the second circuit unit 20 according to a potential difference from the reference electric potential. In FIG. 1, the reference electric potential terminal 3A is connected to the first circuit unit 10, and the reference electric potential terminals 3B and 3C are connected to the second circuit unit 20. The reference electric potential terminals may be integrated into a single unit for the first circuit unit 10 and the second circuit unit 20.

<DC Application Terminal>

The DC application terminal 4 is connected to the power supply 90, and applies a DC current or a DC voltage to the first magnetoresistance effect element 12 and the second magnetoresistance effect element 22 in the laminating direction. The first magnetoresistance effect element 12 is connected to the DC application terminal 4 that can connect the power supply 90 configured to apply a DC current or a DC voltage to the first magnetoresistance effect element 12. The second magnetoresistance effect element 22 is connected to the DC application terminal 4 that can connect the power supply 90 configured to apply a DC current or a DC voltage to the second magnetoresistance effect element 22. The DC current in the specification includes a current having a magnitude varying as time elapses, which is a current having a direction that does not vary as time elapses. In addition, the DC voltage includes a voltage having a magnitude varying as time elapses, which is a voltage having a polarity that does not vary as time elapses. The power supply 90 may be a DC current source or a DC voltage source. The power supply 90 may be a DC current source configured to generate a constant DC current or may be a DC voltage source configured to generate a constant DC voltage. In addition, the power supply 90 may be a DC current source configured to cause a magnitude of the generated DC current value to vary, or may be a DC voltage source configured to cause a magnitude of the generated DC voltage value to vary.

A current density of the DC current applied to each of the first magnetoresistance effect element 12 and the second magnetoresistance effect element 22 is preferably smaller than an oscillating threshold current density of the first magnetoresistance effect element 12 and the second magnetoresistance effect element 22. The oscillating threshold current density of each of the first magnetoresistance effect element 12 and the second magnetoresistance effect element 22 is a current density of a threshold at which the magnetization of each of the magnetization free layers 12B and 22B starts precession at a constant frequency and a constant amplitude and each of the first magnetoresistance effect element 12 and the second magnetoresistance effect element 22 oscillates (an output (a resistance value) of each of the first magnetoresistance effect element 12 and the second magnetoresistance effect element 22 varies at a constant frequency and a constant amplitude) due to applying a current having a current density with this value or more.

In the example shown in FIG. 1, while the power supply 90 is connected to the DC application terminal 4 such that a DC current $I_{DC}$ flows through the first magnetoresistance effect element 12 from the magnetization free layer 12B to the magnetization fixed layer 12A, a flow direction of the current applied to the first magnetoresistance effect element 12 is not particularly limited. In addition, in the example shown in FIG. 1, while the power supply 90 is connected to the DC application terminal 4 such that the DC current $I_{DC}$ flows through the second magnetoresistance effect element 22 from the magnetization fixed layer 22A to the magnetization free layer 22B, a flow direction of the current applied to the second magnetoresistance effect element 22 is not particularly limited.

<Other Configurations>

The inductor 92 and a capacitor 94 are disposed in the magnetoresistance effect module 100. The inductor 92 cuts a high frequency component of the current, and allows an unchangeable component of the current to pass therethrough. The capacitor 94 allows the high frequency component of the current to pass, and cuts the unchangeable component of the current. The inductor 92 is disposed on a portion in which a flow of the high frequency current $I_{RC}$ is to be suppressed, and the capacitor 94 is disposed on a portion in which a flow of the DC current $I_{DC}$ is to be suppressed. In FIG. 1, using the inductor 92, the high frequency current $I_{RC}$ output from the counter electrode 15 is controlled such that it flows through the first conductor 24 without being branched off, and the high frequency current $I_{RC}$ output from the first electrode 27 is controlled such that it flows through the second port 2 without being branched off. In addition, by the capacitor 94, flowing of the DC current $I_{DC}$ flowing through the first magnetoresistance effect element 12 through the first port 1 and the second magnetoresistance effect element 22 is suppressed, and the DC current $I_{DC}$ flowing through the second magnetoresistance effect element 22 is suppressed from flowing through the second port 2.

A chip inductor, an inductor by a pattern line, a resistance element having an inductor component, and so on, can be used in the inductor 92. An inductance of the inductor 92 is preferably 10 nH or more. A known member can also be used in the capacitor 94.

The circuit units and the terminals are connected by signal lines. A shape of the signal line is preferably defined as a microstrip line (MSL) type or a coplanar waveguide (CPW) type. When the signal line is designed as a microstrip line (MSL) type or the coplanar waveguide (CPW) type, a line width or a distance from the ground is preferably designed such that a characteristic impedance of the signal line and an impedance of a circuit system are equal to each other. A transmission loss of the signal line can be suppressed by the above-mentioned design.

In addition, the magnetoresistance effect module 100 preferably has a frequency setting mechanism 80. The frequency setting mechanism 80 is a magnetic field applying mechanism configured to apply an external magnetic field, which is a static magnetic field, to the first magnetoresistance effect element 12 and the second magnetoresistance effect element 22. The frequency setting mechanism 80 sets a ferromagnetic resonance frequency of the magnetization free layers 12B and 22B of the first magnetoresistance effect element 12 and the second magnetoresistance effect element 22. A frequency of the signal output from the magnetoresistance effect module 100 varies according to the ferromagnetic resonance frequency of the magnetization free layers 12B and 22B. That is, a frequency of the output signal can be set by the frequency setting mechanism 80.

The frequency setting mechanism 80 may be provided on each of the first magnetoresistance effect element 12 and the second magnetoresistance effect element 22 or may be provided as an integrated single unit. The frequency setting mechanism 80 is constituted by, for example, an electromagnet type or stripline type magnetic field applying mechanism that can variably control the applied magnetic field intensity using either a voltage or a current. In addition, the frequency setting mechanism may be constituted by combining an electromagnet type or stripline type magnetic field applying mechanism that can variably control the applied magnetic field intensity, and a permanent magnet configured to supply only a certain magnetic field.

<Function of Magnetoresistance Effect Device>

When a high frequency signal is input to the magnetoresistance effect module 100 from the first port 1, the high frequency current $I_{RC}$ corresponding to the high frequency signal flows through the first circuit unit 10. The high frequency current $I_{RC}$ flows through the first magnetoresistance effect element 12.

The magnetization of the magnetization free layer 12B is oscillated by receiving a spin transfer torque according to the high frequency current $I_{RC}$ flowing through the first magnetoresistance effect element 12. The magnetization of the magnetization free layer 12B oscillates greatly due to a ferromagnetic resonance phenomenon when the frequency of the high frequency current $I_{RC}$ is in the vicinity of the ferromagnetic resonance frequency of the magnetization free layer 12B. When the oscillation of the magnetization of the magnetization free layer 12B is increased, a resistance value of the first magnetoresistance effect element 12 greatly increases. A variation in resistance value is output from the first magnetoresistance effect element 12 (the first circuit unit 10) by applying the DC current $I_{DC}$ to the first magnetoresistance effect element 12 in the laminating direction. A sum of the output by the variation in resistance value due to the ferromagnetic resonance phenomenon and the output by the high frequency current $I_{RC}$ flowing through the first magnetoresistance effect element 12 is output from the first magnetoresistance effect element 12 (the first circuit unit 10). The output due to variation in resistance value due to the ferromagnetic resonance phenomenon increases as the variation in resistance value increases. That is, the output from the first magnetoresistance effect element 12 (the first circuit unit 10) is increased with respect to the signal of the frequency in the vicinity of the ferromagnetic resonance frequency of the magnetization free layer 12B, and reduced with respect to the signal of the frequency deviated from the vicinity of the ferromagnetic resonance frequency of the magnetization free layer 12B because a variation amount of the resistance value of the first magnetoresistance effect element 12 is reduced.

Next, the high frequency current $I_{RC}$ output from the first circuit unit 10 passes through the capacitor 94 and flows through the second circuit unit 20. The high frequency magnetic field is generated as the high frequency current $I_{RC}$ flows to the first conductor 24 of the second circuit unit 20. The generated high frequency magnetic field is applied to the magnetization free layer 22B of the second magnetoresistance effect element 22. The magnetization of the magnetization free layer 22B is oscillated by receiving the high frequency magnetic field generated by the high frequency current $I_{RC}$ flowing through the first conductor 24. The magnetization of the magnetization free layer 22B is largely oscillated when the frequency of the high frequency current $I_{RC}$ is in the vicinity of the ferromagnetic resonance frequency of the magnetization free layer 22B.

When the oscillation of the magnetization of the magnetization free layer 22B is increased, a variation in resistance value of the second magnetoresistance effect element 22 is increased. The variation in resistance value is output from the second magnetoresistance effect element 22 (the second circuit unit 20) and output from the second port 2 by applying the DC current $I_{DC}$ to the second magnetoresistance effect element 22 in the laminating direction. The output from the second magnetoresistance effect element 22 (the second circuit unit 20) is increased with respect to the signal of the frequency in the vicinity of the ferromagnetic resonance frequency of the magnetization free layer 22B and reduced with respect to the signal of the frequency deviated from the vicinity of the ferromagnetic resonance frequency of the magnetization free layer 22B because a variation amount of the resistance value of the second magnetoresistance effect element 22 is reduced.

Figure 2A:
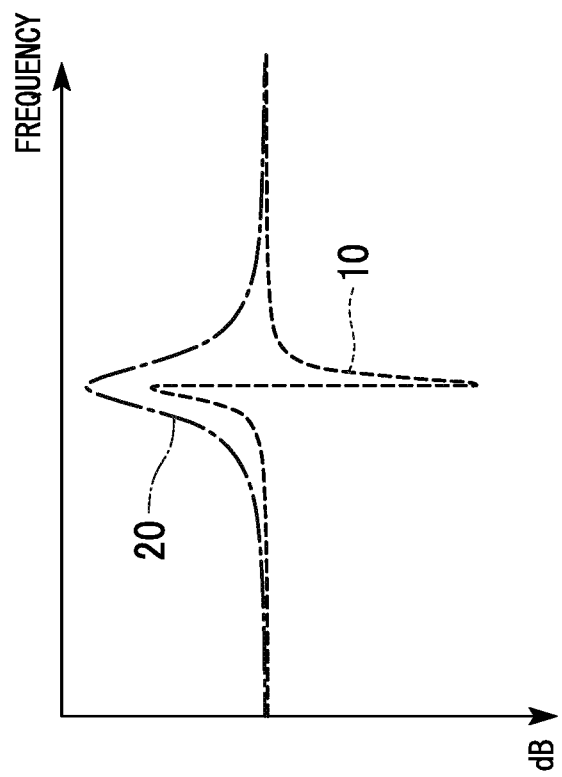
FIG. 2A is a schematic view showing signal characteristics when each of the first circuit unit and the second circuit unit are provided alone
Figure 2B:
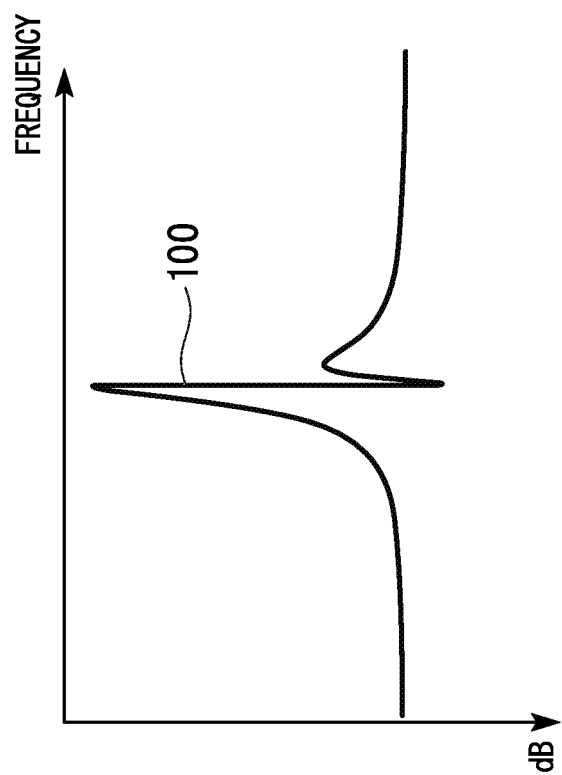
FIG. 2B is a schematic view showing signal characteristics of the magnetoresistance effect module including the first circuit unit and the second circuit unit.

FIG. 2A is a schematic view showing signal characteristics when each of the first circuit unit 10 and the second circuit unit 20 are provided alone. FIG. 2B is a schematic view showing signal characteristics of the magnetoresistance effect module 100 including them. The signal characteristics correspond to a ratio of output power with respect to input power. As shown in FIG. 2A, the first circuit unit 10 shows anti-Lorentzian-like signal characteristics by itself. The anti-Lorentzian signal characteristics are signal characteristics that can be fitted by a Cauchy-Lorentzian distribution having an antisymmetric shape, and the anti-Lorentzian-like signal characteristics are signal characteristics having two peaks of a peak at which pass characteristics are increased (a peak protruding upward) and a peak at which pass characteristics are decreased (a peak protruding downward). The signal characteristics when the first circuit unit 10 is provided alone are abruptly varied between the peak protruding upward and the peak protruding downward.

On the other hand, the second circuit unit 20 in which the magnetic field driving element 21 is incorporated shows Lorentzian-like signal characteristics when the second circuit unit 20 is provided alone. The Lorentzian signal characteristics are signal characteristics that can be fitted by the Cauchy-Lorentzian distribution, and the Lorentzian-like signal characteristics are signal characteristics having either the peak at which pass characteristics are increased or the peak at which pass characteristics are decreased. It is considered that a difference between the signal characteristics of the second circuit unit 20 and the signal characteristics of the first circuit unit 10 is caused by an element configuration, a difference of a flowing side of a high frequency current with respect to a magnetoresistance effect element, or the like.

When the signal characteristics of the first circuit unit 10 and the signal characteristics of the second circuit unit 20 overlap each other, the signal characteristics of the magnetoresistance effect module 100 are obtained. As shown in FIGS. 2A and 2B, the signal characteristics of the magnetoresistance effect module 100 have a pass band, in which steepness characteristics on a high frequency side are good, in the vicinity of the signal peak position (a peak protruding upward) of the first circuit unit 10 and the signal peak position of the second circuit unit 20. The magnetoresistance effect module 100 (or the magnetoresistance effect device) may be used as a high-frequency filter that can allow a high frequency signal having a specified frequency to selectively pass therethrough using the signal characteristics.

The signal peak position (a ferromagnetic resonance frequency of the magnetization free layer 12B of the first magnetoresistance effect element 12) of the first circuit unit 10 and the signal peak position (a ferromagnetic resonance frequency of the magnetization free layer 22B of the second magnetoresistance effect element 22) of the second circuit unit 20 may coincide with each other or may be different from each other. When the signal peak positions are different, a difference between frequencies of two signal peaks is preferably within a range of 15% or less and more preferably 7.5% or less with respect to a central frequency of the signal peaks (an average value of the frequencies of the two signal peaks. In addition, the difference between the frequencies of the two signal peaks is preferably 200 MHz or less and more preferably 100 MHz or less when mentioned as a specific numerical value. In addition, the difference between the frequencies of the two signal peaks is preferably within a range of 0.5% more with respect to the central frequency and preferably 5 MHz or more. While the signal peaks in the anti-Lorentzian-like signal characteristics are the peak protruding upward and the peak protruding downward, the difference between the frequencies of the two signal peaks is a difference between a frequency of the peak protruding downward in the anti-Lorentzian-like signal characteristics and a frequency of the signal peak of the second circuit unit 20. While the first circuit unit 10 shows signal characteristics as shown in FIG. 2A when the first circuit unit 10 is individual, in this case, the ferromagnetic resonance frequency of the magnetization free layer 12B of the first magnetoresistance effect element 12 may be higher than or the same as the ferromagnetic resonance frequency of the magnetization free layer 22B of the second magnetoresistance effect element 22. In addition, the signal peak positions of the first circuit unit 10 and the second circuit unit 20 can be controlled by the frequency setting mechanism 80. In addition, the position of the signal peak of the circuit unit (the ferromagnetic resonance frequency of the magnetization free layer of the magnetoresistance effect element) can be varied also by a shape of the magnetoresistance effect element when seen in a plan view or a layer component of the magnetoresistance effect element.

Hereinabove, while the embodiment of the present disclosure has been described in detail with reference to the accompanying drawings, configurations in the embodiment and combinations thereof are merely exemplary, and additions, omissions, substitutions and other modifications may be made without departing from the spirit of the present disclosure.

Figure 3:
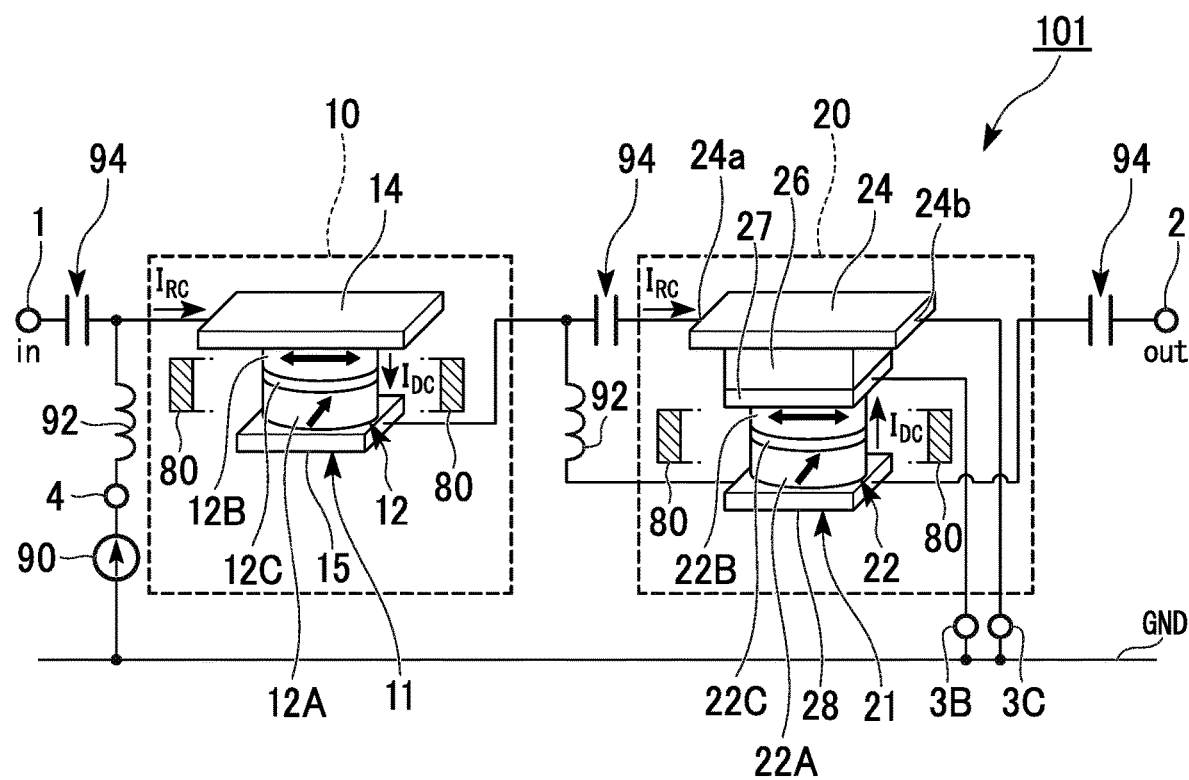
FIG. 3 is a schematic view showing a circuit configuration of another example of the magnetoresistance effect module according to the first embodiment.

FIG. 3 is a schematic view showing a circuit configuration of another example of the magnetoresistance effect module according to the first embodiment. In FIG. 3, the same components as in FIG. 1 are designated by the same reference numerals. A magnetoresistance effect module 101 shown in FIG. 3 is distinguished from the magnetoresistance effect module 100 shown in FIG. 1 in that the DC application terminal 4 and the power supply 90 are shared by the current driven element 11 and the magnetic field driving element 21. In FIG. 3, the reference electric potential terminals 3B and 3C are connected to the second circuit unit 20. In addition, in FIG. 3, the reference electric potential terminal 3B is connected to the first circuit unit 10 via the second circuit unit 20 and the inductor 92. As shown in FIG. 3, even when the DC application terminal 4 and the power supply 90 are shared, a variation in the signal characteristics does not occur. For this reason, the signal characteristics of the first circuit unit 10 and the second circuit unit 20 overlap each other, and the signal characteristics having good steepness characteristics in the magnetoresistance effect module 101 are obtained.

Figure 4:
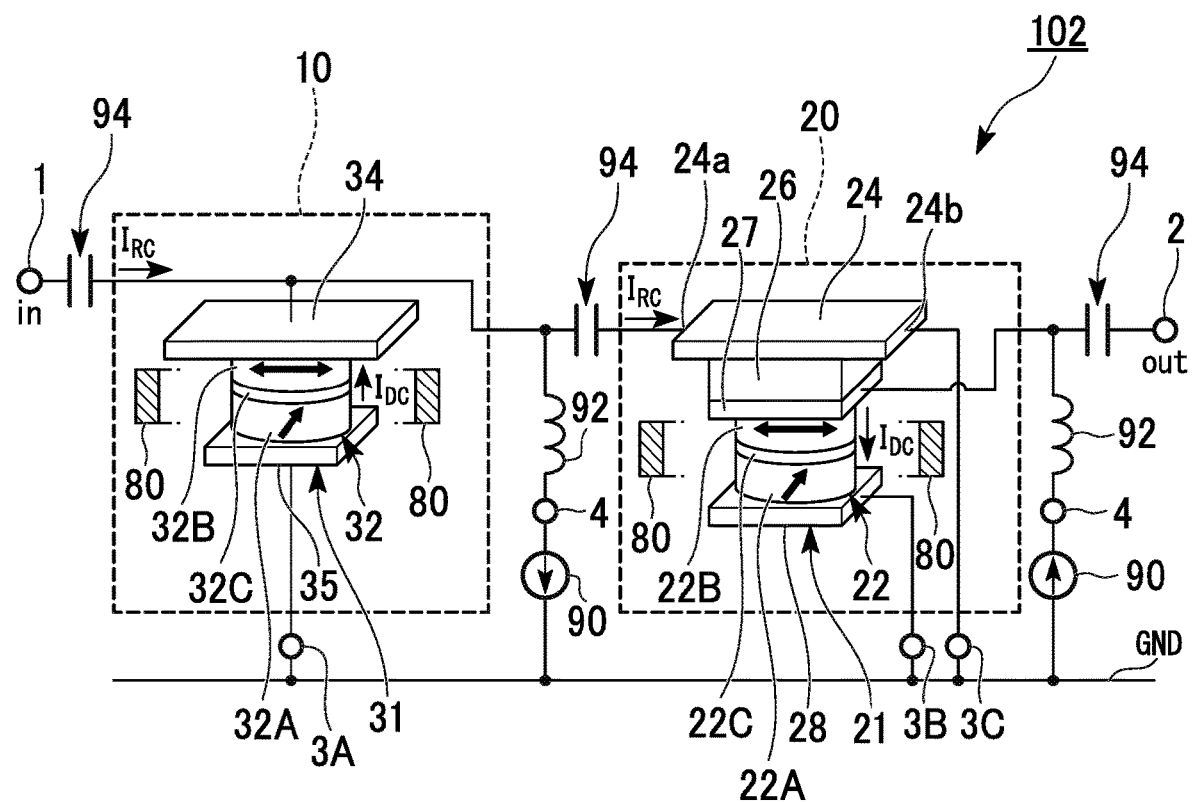
FIG. 4 is a schematic view showing a circuit configuration of another example of the magnetoresistance effect module according to the first embodiment.

FIG. 4 is a schematic view showing a circuit configuration of another example of the magnetoresistance effect module according to the first embodiment. In FIG. 4, the same components as in FIG. 1 are designated by the same reference numerals. A magnetoresistance effect module 102 shown in FIG. 4 is distinguished from the magnetoresistance effect module 100 shown in FIG. 1 in that a parallel type current driven element 31 is incorporated in the first circuit unit 10.

The current driven element 31 includes a third magnetoresistance effect element 32.

The third magnetoresistance effect element 32 has a magnetization fixed layer 32A, a magnetization free layer 32B and a spacer layer 32C. A cap layer may be provided on a side of the magnetization free layer 32B opposite to the spacer layer 32C (between the magnetization free layer 32B and a first electrode 34). The magnetization free layer 32B and the cap layer preferably come in contact with each other. The first electrode 34 is provided on one end of the third magnetoresistance effect element 32 in the laminating direction, and a counter electrode 35 is provided on the other end in the laminating direction. The one end of the third magnetoresistance effect element 32 is connected to an input side (the first port 1) and an output side (the second circuit unit 20 side) of the high frequency current $I_{RC}$ in the first circuit unit 10, and the other end of the third magnetoresistance effect element 32 is connected to the reference electric potential terminal 3A. The output side (the second circuit unit 20) of the high frequency current $I_{RC}$ and the reference electric potential terminal 3A have a parallel positional relation when seen from the input side of the high frequency current $I_{RC}$ in the first circuit unit 10. That is, the second circuit unit 20 and the reference electric potential terminal 3A have a parallel positional relation by the high frequency current $I_{RC}$. In other words, the third magnetoresistance effect element 32 is parallelly connected to the first port 1. The high frequency current $I_{RC}$ is branched off into and flows to the output side of the high frequency current $I_{RC}$ and the third magnetoresistance effect element 32 in the first circuit unit 10. In the example of FIG. 4, the high frequency current $I_{RC}$ input from the first port 1 is input to the first circuit unit 10. In addition, the third magnetoresistance effect element 32 is connected to the DC application terminal 4 that can connect the power supply 90 configured to apply a DC current or a DC voltage to the third magnetoresistance effect element 32. In the current driven element 31 shown in FIG. 4, while the DC current $I_{DC}$ flows through the third magnetoresistance effect element 32 from the magnetization fixed layer 32A toward the magnetization free layer 32B, a direction of the current flowing through the third magnetoresistance effect element 32 is not particularly limited.

Magnetization of the magnetization free layer 32B is oscillated by receiving a spin transfer torque according to the high frequency current $I_{RC}$ flowing through the third magnetoresistance effect element 32. Magnetization of the magnetization free layer 32B is largely oscillated when the frequency of the high frequency current $I_{RC}$ is in the vicinity of the ferromagnetic resonance frequency of the magnetization free layer 32B. When the oscillation of the magnetization of the magnetization free layer 32B is increased, a variation in resistance value of the third magnetoresistance effect element 32 is increased. The variation in the resistance value is output from the third magnetoresistance effect element 32 by applying the DC current $I_{DC}$ to the third magnetoresistance effect element 32 in the laminating direction. A sum of the output caused by a variation in resistance value due to the ferromagnetic resonance phenomenon and the output caused by the high frequency current $I_{RC}$ flowing to the output side of the high frequency current $I_{RC}$ in the first circuit unit 10 is output to the first circuit unit 10.

In addition, the size of the third magnetoresistance effect element 32 is desirably 250 nm or less at a long side of a shape of the third magnetoresistance effect element 32 when seen in a plan view. In addition, a short side of the shape of the third magnetoresistance effect element 32 when seen in a plan view is desirably 20 nm or more. In the case of the current driven element 31, the size of the third magnetoresistance effect element 32 is preferably as small as possible. An effect of the spin transfer torque is increased and a ferromagnetic resonance phenomenon having high efficiency is obtained as the size of the third magnetoresistance effect element 32 is reduced. An area of the shape of the third magnetoresistance effect element 32 when seen in a plan view is preferable to be smaller than an area of the shape of the second magnetoresistance effect element 22 when seen in a plan view.

Figure 5A:
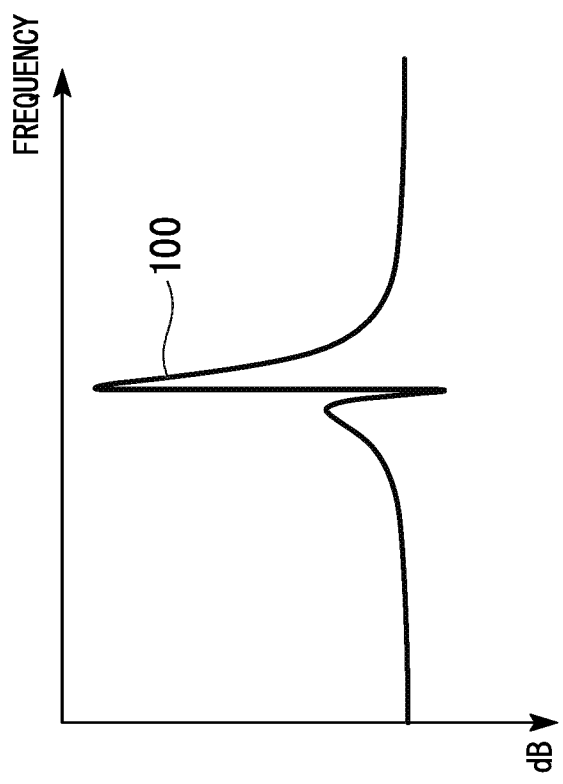
FIG. 5A is a schematic view showing signal characteristics when each of the first circuit unit and the second circuit unit are provided alone
Figure 5B:
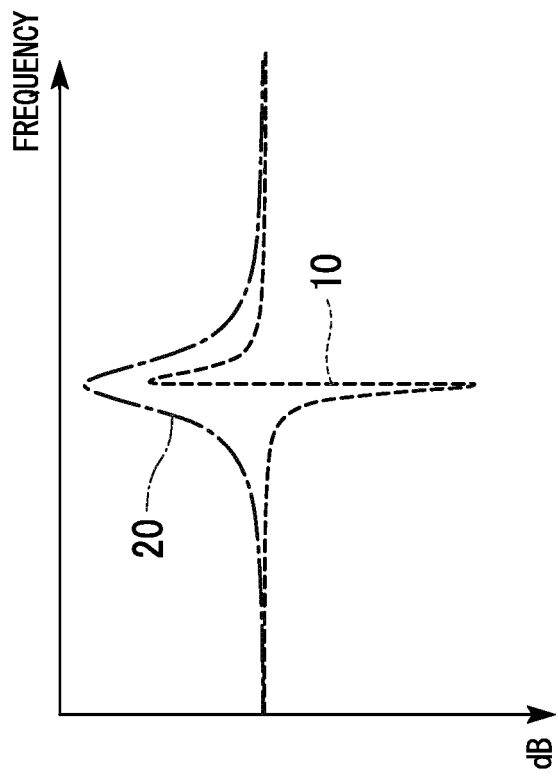
FIG. 5B is a schematic view showing signal characteristics of the magnetoresistance effect module including the first circuit unit and the second circuit unit.

The third magnetoresistance effect element 32 of the parallel type current driven element 31 of the first circuit unit 10 shown in FIG. 4 is distinguished from the first magnetoresistance effect element 12 of the series type current driven element 11 of the first circuit unit 10 shown in FIG. 1 at a side of the first circuit unit 10 connected to the input side and the output side of the high frequency current. For this reason, as shown in FIG. 5A, a tendency of the signal characteristics when the first circuit unit 10 shown in FIG. 4 is individual is reversed from a tendency of the signal characteristics when the first circuit unit 10 shown in FIG. 1 is individual. Since the signal characteristics of the first circuit unit 10 and the signal characteristics of the second circuit unit 20 overlap each other, as shown in FIG. 5B, the signal characteristics of the magnetoresistance effect module 102 have an excellent pass band in steepness characteristics on a low frequency side. In this case, when the element incorporated in the first circuit unit 10 is the parallel type current driven element 31, the ferromagnetic resonance frequency of the magnetization free layer 32B of the third magnetoresistance effect element 32 is preferably smaller than or the same as the ferromagnetic resonance frequency of the magnetization free layer 22B of the second magnetoresistance effect element 22.

As shown in FIG. 4, the element incorporated in the first circuit unit 10 is not the series type current driven element and may be the parallel type current driven element 31. Even in the magnetoresistance effect module 102 shown in FIG. 4, like the magnetoresistance effect module 100 shown in FIG. 1, the signal characteristics of the current driven element 31 and the magnetic field driving element 21 overlap each other, the signal characteristics having good steepness characteristics are obtained.

Figure 6:
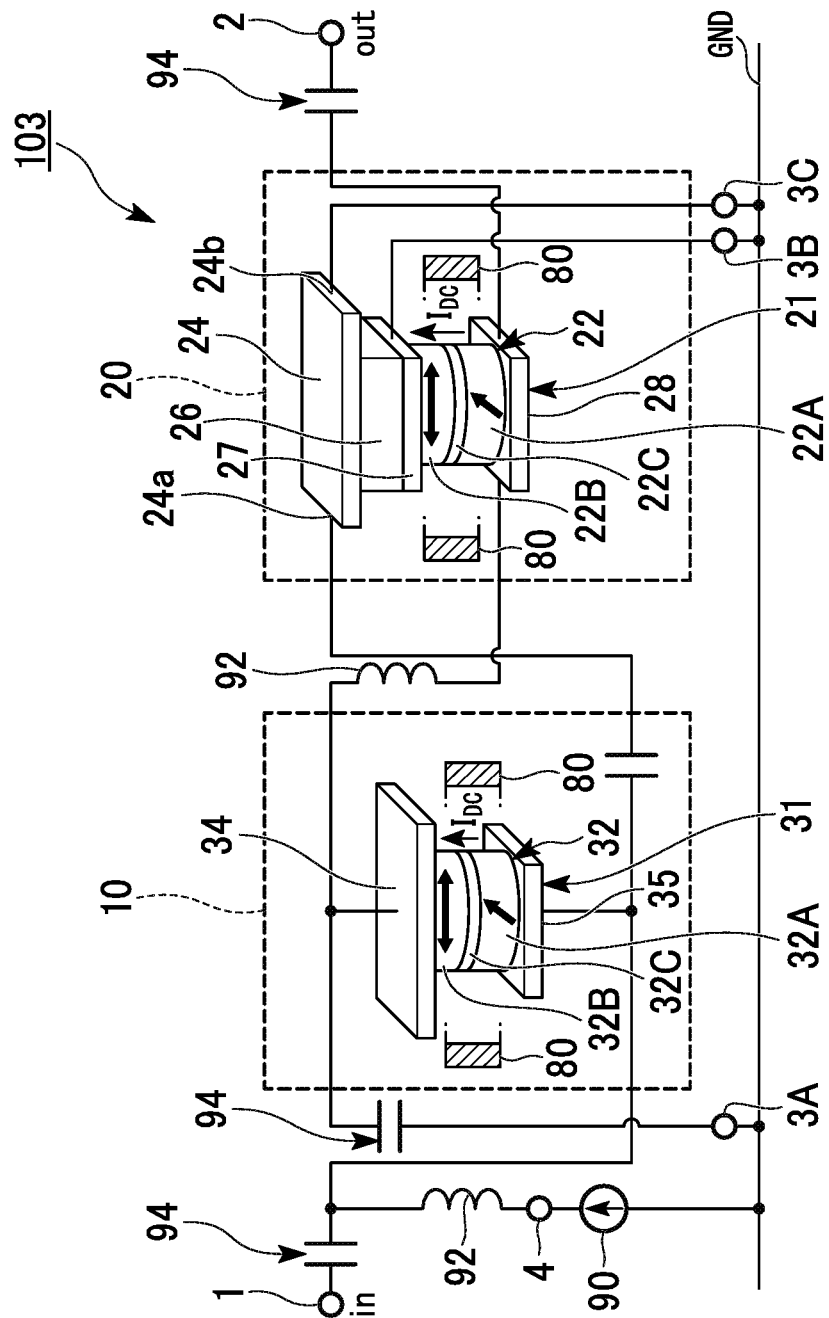
FIG. 6 is a schematic view showing a circuit configuration of another example of the magnetoresistance effect module according to the first embodiment.

FIG. 6 is a schematic view showing a circuit configuration of another example of the magnetoresistance effect module according to the first embodiment. In FIG. 6, the same components as in FIG. 4 are designated by the same reference numerals. A magnetoresistance effect module 103 shown in FIG. 6 is distinguished from the magnetoresistance effect module 102 shown in FIG. 4 in that the DC application terminal 4 and the power supply 90 are shared by the second magnetoresistance effect element 22 and the third magnetoresistance effect element 32. In addition, in the magnetoresistance effect module 103 shown in FIG. 6, the counter electrode 35 is provided on one end of the third magnetoresistance effect element 32 in the laminating direction connected to the input side of the high frequency current and the output side of the high frequency current in the first circuit unit 10, and the first electrode 34 is provided on the other end of the third magnetoresistance effect element 32 in the laminating direction connected to the reference electric potential terminal 3A. In FIG. 6, the reference electric potential terminal 3A is connected (connected in an AC manner (in a high frequency manner)) to the first circuit unit 10 via the capacitor 94, and the reference electric potential terminals 3B and 3C are connected to the second circuit unit 20. In addition, in FIG. 6, the reference electric potential terminal 3B is connected (connected in a DC manner) to the first circuit unit 10 via the second circuit unit 20 and the inductor 92. The signal characteristics of the magnetoresistance effect module 103 shown in FIG. 6 has the same tendency as that of the signal characteristics of the magnetoresistance effect module 102 shown in FIG. 4.

Figure 7:
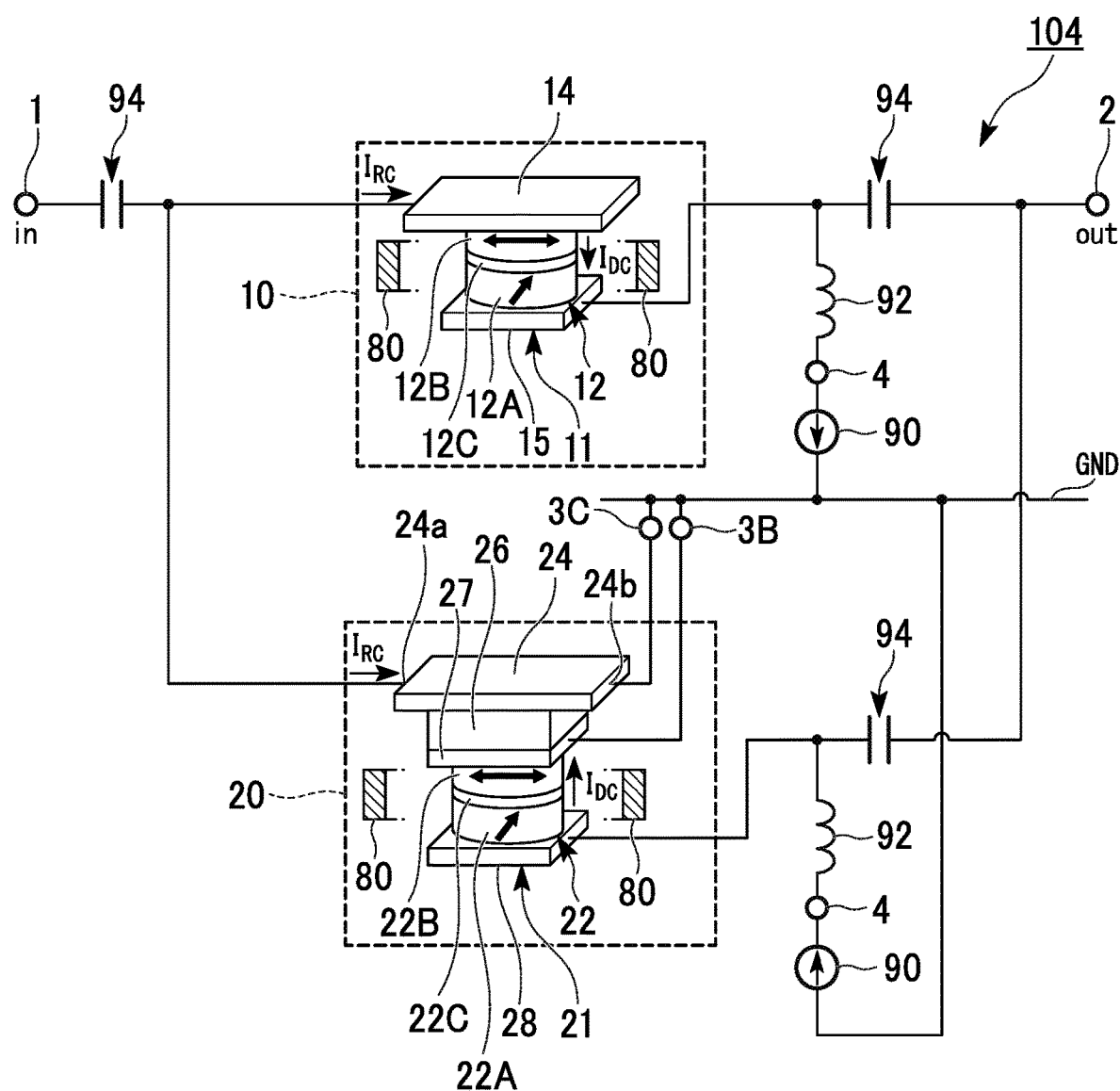
FIG. 7 is a schematic view showing a circuit configuration of another example of the magnetoresistance effect module according to the first embodiment.

In addition, FIG. 7 is a schematic view showing a circuit configuration of another example of the magnetoresistance effect module according to the first embodiment. In FIG. 7, the same components as in FIG. 1 are designated by the same reference numerals. A magnetoresistance effect module 104 shown in FIG. 7 is distinguished from the magnetoresistance effect module 100 shown in FIG. 1 in that the first circuit unit 10 and the second circuit unit 20 are parallelly connected to the first port 1. In FIG. 7, the reference electric potential terminals 3B and 3C are connected to the second circuit unit 20. In addition, in FIG. 7, the reference electric potential terminal 3C is connected to the first circuit unit 10 via the second circuit unit 20 (the first conductor 24).

As shown in FIG. 7, the first circuit unit 10 and the second circuit unit 20 are not serially connected and may be parallelly connected to each other. Even in the magnetoresistance effect module 104 shown in FIG. 7, the signal characteristics of the first circuit unit 10 and the second circuit unit 20 overlap each other, and the signal characteristics having good steepness characteristics are obtained. The signal characteristics of the magnetoresistance effect module 104 shown in FIG. 7 have the same tendency as that of the signal characteristics of the magnetoresistance effect module 100 shown in FIG. 1.

Figure 8:
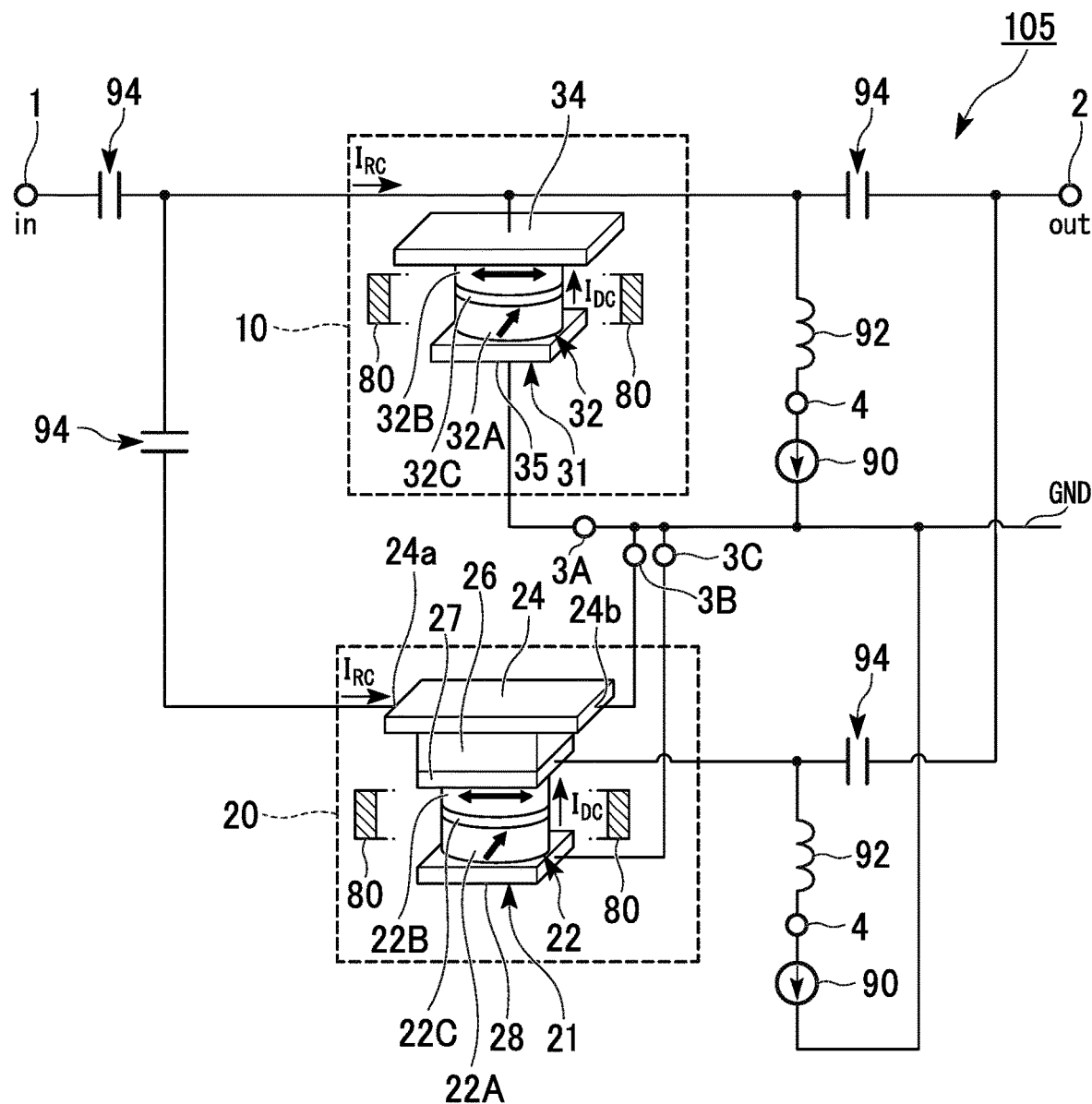
FIG. 8 is a schematic view showing a circuit configuration of another example of the magnetoresistance effect module according to the first embodiment.

In addition, FIG. 8 is a schematic view showing a circuit configuration of another example of the magnetoresistance effect module according to the first embodiment. In FIG. 8, the same components as in FIG. 4 are designated by the same reference numerals. A magnetoresistance effect module 105 shown in FIG. 8 is distinguished from the magnetoresistance effect module 102 shown in FIG. 4 in which the first circuit unit 10 and the second circuit unit 20 are parallelly connected to the first port 1.

As shown in FIG. 8, the first circuit unit 10 and the second circuit unit 20 are not serially connected and may be parallelly connected to each other. Even in the magnetoresistance effect module 105 shown in FIG. 8, the signal characteristics of the first circuit unit 10 and the second circuit unit 20 overlap each other, and the signal characteristics having good steepness characteristics are obtained. The signal characteristics of the magnetoresistance effect module 105 shown in FIG. 8 have the same tendency as that of the signal characteristics of the magnetoresistance effect module 102 shown in FIG. 4.

Second Embodiment

In a second embodiment, steepness characteristics of signal characteristics of both of a low frequency side and a high frequency side are improved using two current driven elements.

Figure 9:
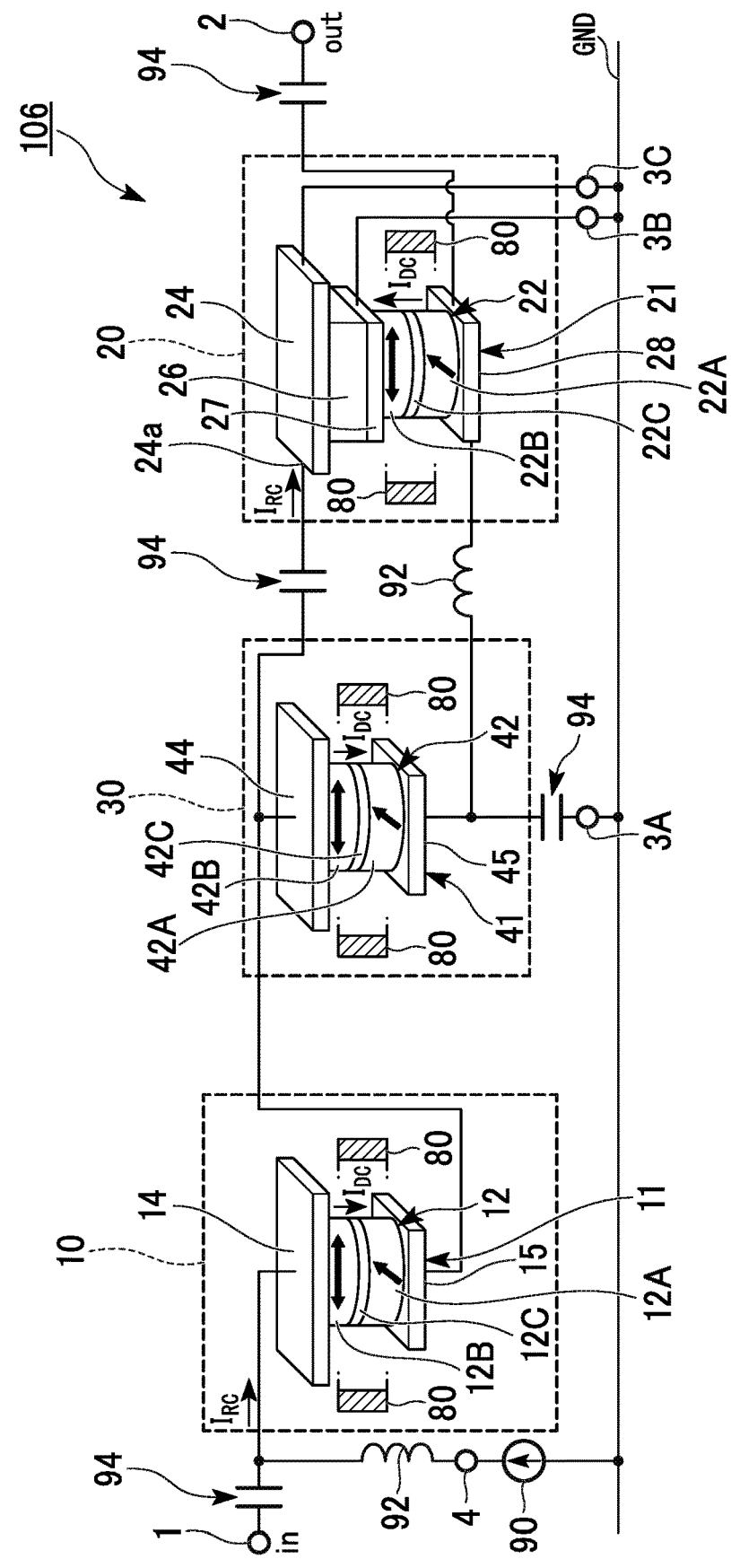
FIG. 9 is a schematic view showing a circuit configuration of a magnetoresistance effect module according to a second embodiment.

FIG. 9 is a schematic view showing a circuit configuration of a magnetoresistance effect module 106 according to the second embodiment. The magnetoresistance effect module 106 shown in FIG. 9 is distinguished from the magnetoresistance effect module 100 shown in FIG. 1 in that a third circuit unit 30 is connected. In FIG. 9, the same components as in FIG. 1 are designated by the same reference numerals.

The third circuit unit 30 shown in FIG. 9 is connected between the first port 1 and the second port 2, and the first circuit unit 10 and the second circuit unit 20 are serially connected to the first port 1. A parallel type current driven element 41 having the same configuration as that of the current driven element 31 of the magnetoresistance effect module 103 shown in FIG. 4 is incorporated in the third circuit unit 30.

The first circuit unit 10, the second circuit unit 20 and the third circuit unit 30 are serially connected to each other. In FIG. 9, while the first circuit unit 10, the third circuit unit 30 and the second circuit unit 20 are connected to each other in sequence as an example, a connection sequence thereof is not particularly limited.

The current driven element 41 includes a fourth magnetoresistance effect element 42. The fourth magnetoresistance effect element 42 includes a magnetization fixed layer 42A, a magnetization free layer 42B, and a spacer layer 42C provided therebetween. A cap layer may be provided on a side of the magnetization free layer 42B opposite to the spacer layer 42C (between the magnetization free layer 42B and a first electrode 44). The magnetization free layer 42B and the cap layer may come in contact with each other. The first electrode 44 is provided on one end of the fourth magnetoresistance effect element 42 in the laminating direction, and a counter electrode 45 is provided on the other end in the laminating direction. In the example of FIG. 9, the high frequency current $I_{RC}$ output from the first circuit unit 10 is input to the third circuit unit 30. The one end of the fourth magnetoresistance effect element 42 is connected to the input side (the first circuit unit 10 side) and the output side (the second circuit unit 20 side) of the high frequency current $I_{RC}$ in the third circuit unit 30, and the other end of the fourth magnetoresistance effect element 42 is connected to the reference electric potential terminal 3A. The output side (the second circuit unit 20) of the high frequency current $I_{RC}$ and the reference electric potential terminal 3A have a parallel positional relation when seen from the input side of the high frequency current $I_{RC}$ in the third circuit unit 30. That is, the second circuit unit 20 and the reference electric potential terminal 3A have the parallel positional relation by the high frequency current $I_{RC}$. In other words, the fourth magnetoresistance effect element 42 is parallelly connected to the first port 1. The high frequency current $I_{RC}$ is branched off and flows to the output side of the high frequency current $I_{RC}$ in the third circuit unit 30 and the fourth magnetoresistance effect element 42. In addition, the fourth magnetoresistance effect element 42 is connected to the DC application terminal 4 that can connect the power supply 90 configured to apply a DC current or a DC voltage to the fourth magnetoresistance effect element 42. In the magnetoresistance effect module 106 shown in FIG. 9, the DC application terminal 4 and the power supply 90 are shared by the first magnetoresistance effect element 12, the fourth magnetoresistance effect element 42 and the second magnetoresistance effect element 22. In FIG. 9, the reference electric potential terminal 3A is connected (connected in an AC manner (in a high frequency manner)) to the third circuit unit 30 via the capacitor 94, and the reference electric potential terminals 3B and 3C are connected to the second circuit unit 20. In addition, in FIG. 9, the reference electric potential terminal 3B is connected (connected in a DC manner) to the third circuit unit 30 via the second circuit unit 20 and the inductor 92. In addition, in FIG. 9, the reference electric potential terminal 3B is connected to the first circuit unit 10 via the second circuit unit 20, the inductor 92 and the third circuit unit 30.

Further, the configurations of the first electrode 44, the counter electrode 45, the fourth magnetoresistance effect element 42 in the current driven element 41 of the third circuit unit 30 (layer configurations, sizes, and so on, of the magnetization fixed layer 42A, the spacer layer 42C, the magnetization free layer 42B, the cap layer, and so on) may be the same as in the description of, for example, the current driven element 11 of the first circuit unit 10.

In the example shown in FIG. 9, while the power supply 90 is connected to the DC application terminal 4 such that the DC current $I_{DC}$ flows through the first magnetoresistance effect element 12 from the magnetization free layer 12B to the magnetization fixed layer 12A and flows through the fourth magnetoresistance effect element 42 from the magnetization free layer 42B to the magnetization fixed layer 42A, and a direction of the current flowing through the first magnetoresistance effect element 12 and the fourth magnetoresistance effect element 42 is not particularly limited.

The high frequency current $I_{RC}$ output from the first circuit unit 10 flows to the third circuit unit 30. In the third circuit unit 30, the high frequency current $I_{RC}$ is branched off and flows to the output side of the high frequency current $I_{RC}$ in the third circuit unit 30 and the fourth magnetoresistance effect element 42. Then, magnetization of the magnetization free layer 42B is oscillated by receiving a spin transfer torque according to the high frequency current $I_{RC}$ flowing through the fourth magnetoresistance effect element 42. The magnetization of the magnetization free layer 42B is largely oscillated by a ferromagnetic resonance phenomenon when a frequency of the high frequency current $I_{RC}$ is in the vicinity of the ferromagnetic resonance frequency of the magnetization free layer 42B. When the oscillation of the magnetization of the magnetization free layer 42B is increased, a variation in resistance value of the fourth magnetoresistance effect element 42 is increased. The variation in resistance value is output from the fourth magnetoresistance effect element 42 (the third circuit unit 30) by applying the DC current $I_{DC}$ to the fourth magnetoresistance effect element 42 in the laminating direction. A sum of the output caused by the variation in resistance value due to the ferromagnetic resonance phenomenon and the output caused by the high frequency current $I_{RC}$ flowing to the output side of the high frequency current $I_{RC}$ in the third circuit unit 30 is output from the third circuit unit 30.

Figure 10A:
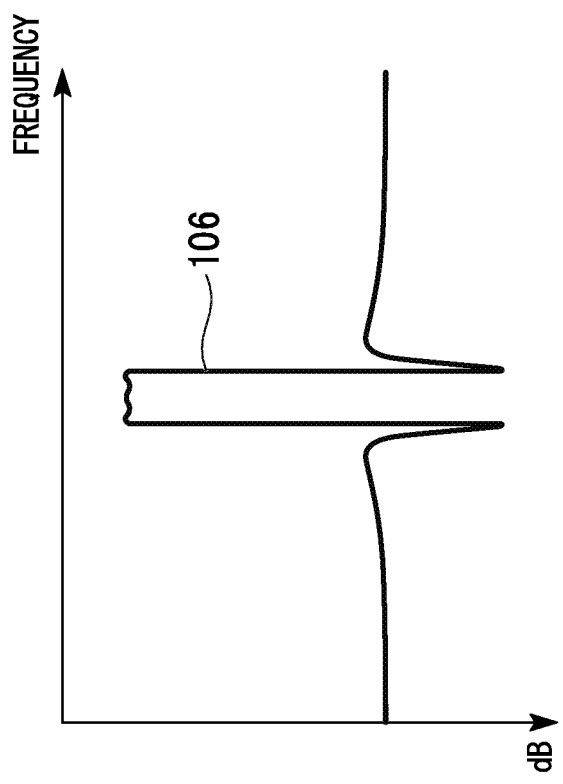
FIG. 10A is a schematic view showing signal characteristics when each the first circuit unit, the second circuit unit and the third circuit unit are provided alone.
Figure 10B:
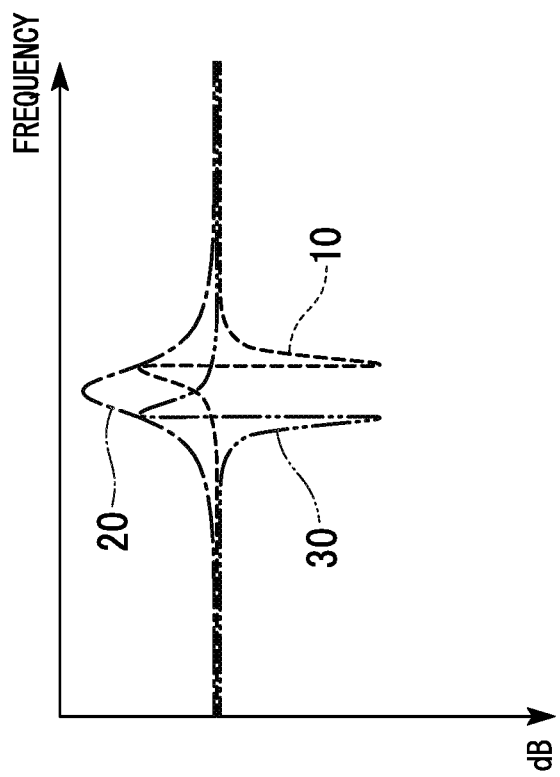
FIG. 10B is a schematic view showing signal characteristics of the magnetoresistance effect module including the first circuit unit, the second circuit unit and the third circuit unit.

FIG. 10A is a schematic view showing signal characteristics when the first circuit unit 10 in which the series type current driven element 11 is incorporated, the third circuit unit 30 in which the parallel type current driven element 41 is incorporated, and the second circuit unit 20 in which the magnetic field driving element 21 is incorporated are provided alone. FIG. 10B is a schematic view showing signal characteristics of the magnetoresistance effect module 106 including them. The signal characteristics correspond to a ratio of output power with respect to input power. FIG. 10A shows signal characteristics when the first circuit unit 10, the second circuit unit 20 and the third circuit unit 30 are provided alone, and FIG. 10B shows signal characteristics of the magnetoresistance effect module 106.

As described above, the first circuit unit 10 and the third circuit unit 30 show anti-Lorentzian-like signal characteristics when they are provided alone. On the other hand, the second circuit unit 20 in which the magnetic field driving element 21 is incorporated shows Lorentzian-like signal characteristics when it is provided alone.

The series type current driven element 11 is incorporated in the first circuit unit 10, and the parallel type current driven element 41 is incorporated in the third circuit unit 30. For this reason, the signal characteristics of the first circuit unit 10 and the signal characteristics of the third circuit unit 30 have a substantially line-symmetrical relation.

When the signal characteristics of the first circuit unit 10, the signal characteristics of the second circuit unit 20 and the signal characteristics of the third circuit unit 30 overlap each other, the signal characteristics of the magnetoresistance effect module 106 are obtained. Since the signal characteristics of the third circuit unit 30 overlap each other, the signal characteristics of the magnetoresistance effect module 106 have a pass band that is advantageous for steepness characteristics on a low frequency side and a high frequency side. The signal peak position of the first circuit unit 10 (the ferromagnetic resonance frequency of the magnetization free layer 12B of the first magnetoresistance effect element 12) and the signal peak position of the third circuit unit 30 (the ferromagnetic resonance frequency of the magnetization free layer 42B of the fourth magnetoresistance effect element 42) are different from each other, and the ferromagnetic resonance frequency of the magnetization free layer 12B of the first magnetoresistance effect element 12 is larger than the ferromagnetic resonance frequency of the magnetization free layer 42B of the fourth magnetoresistance effect element 42. The signal peak position of the second circuit unit 20 (the ferromagnetic resonance frequency of the magnetization free layer 22B of the second magnetoresistance effect element 22) is preferably disposed between the signal peak position of the first circuit unit 10 and the signal peak position of the third circuit unit 30.

A difference between the frequency of the signal peak position of the first circuit unit 10 and the frequency of the signal peak position of the third circuit unit 30 (a difference between the frequencies of the signal peaks) is preferably within a range of 30% or less and more preferably within a range of 15% or less with respect to a central frequency of the two signal peaks. In addition, the difference between the frequencies of the two signal peaks is preferably 400 MHz or less and more preferably 200 MHz or less when the difference is mentioned as a specific numerical value. In addition, the difference between the frequencies of the two signal peaks is preferably within a range of 0.5% or more with respect to the central frequency and preferably 5 MHz or more. In the anti-Lorentzian-like signal characteristics, while the signal peaks are a peak protruding upward and a peak protruding downward, the difference between the frequencies of the two signal peaks was a difference between frequencies of the two peaks protruding downward. The signal peak positions of the first circuit unit 10, the second circuit unit 20 and the third circuit unit 30 can be freely controlled by the frequency setting mechanism 80. In addition, the position of the signal peak of the circuit unit (the ferromagnetic resonance frequency of the magnetization free layer of the magnetoresistance effect element) can be varied also by a shape of the magnetoresistance effect element when seen in a plan view and a layer configuration of the magnetoresistance effect element.

In the magnetoresistance effect module 106 shown in FIG. 9, the third circuit unit 30 is serially connected to the first circuit unit 10 and the second circuit unit 20 in a flow direction of the high frequency current $I_{RC}$. The third circuit unit 30 may be serially or parallelly connected to at least one of the first circuit unit 10 and the second circuit unit 20, and is not limited to the magnetoresistance effect module 106 shown in FIG. 9.

Figure 11A:
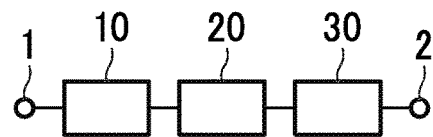
FIGS. 11A to 11H are schematic views showing connection types of the first circuit unit, the second circuit unit and the third circuit unit.
Figure 11B:
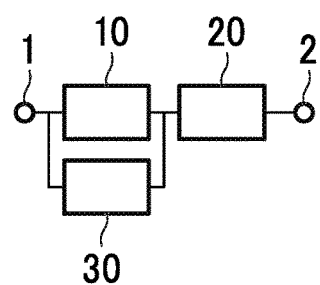
Figure 11C:
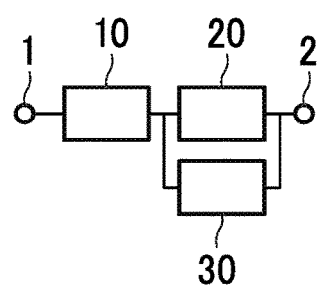
Figure 11D:
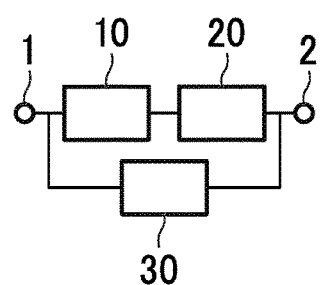
Figure 11E:
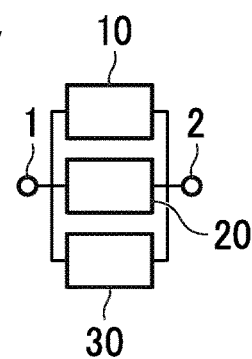
Figure 11F:
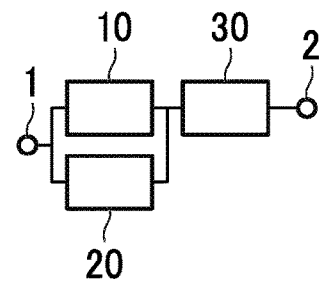
Figure 11G:
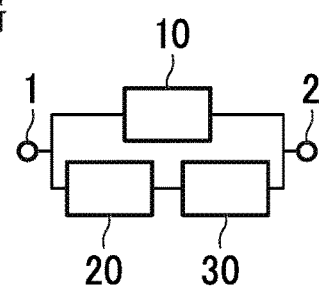
Figure 11H:
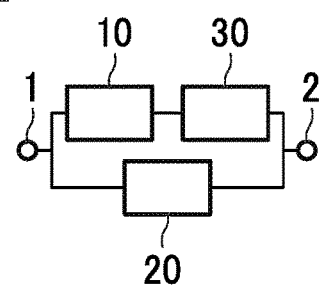

FIGS. 11A to 11H are schematic views showing connection types of the first circuit unit 10, the second circuit unit 20 and the third circuit unit 30. FIG. 11A corresponds to FIG. 9 because all of the units are serially connected, and the serial connection sequence is not limited. In FIG. 11B, the first circuit unit 10 and the second circuit unit 20 are serially connected, and the third circuit unit 30 has a relation parallel to the first circuit unit 10 only. In FIG. 11C, the first circuit unit 10 and the second circuit unit 20 are serially connected, and the third circuit unit 30 has a relation parallel to the second circuit unit 20 only. In FIG. 11D, the first circuit unit 10 and the second circuit unit 20 are serially connected, and the third circuit unit 30 has a relation parallel to the first circuit unit 10 and the second circuit unit 20. In FIG. 11E, all of the units are parallelly connected to each other. In FIG. 11F, the first circuit unit 10 and the second circuit unit 20 are parallelly connected, and the third circuit unit 30 has a relation serial to the first circuit unit 10 and the second circuit unit 20. In FIG. 11G, the first circuit unit 10 and the second circuit unit 20 are parallelly connected, and the third circuit unit 30 has a relation serial to the second circuit unit 20 only. In FIG. 11H, the first circuit unit 10 and the second circuit unit 20 are parallelly connected, and the third circuit unit 30 has a relation serial to the first circuit unit 10 only.

Figure 12:
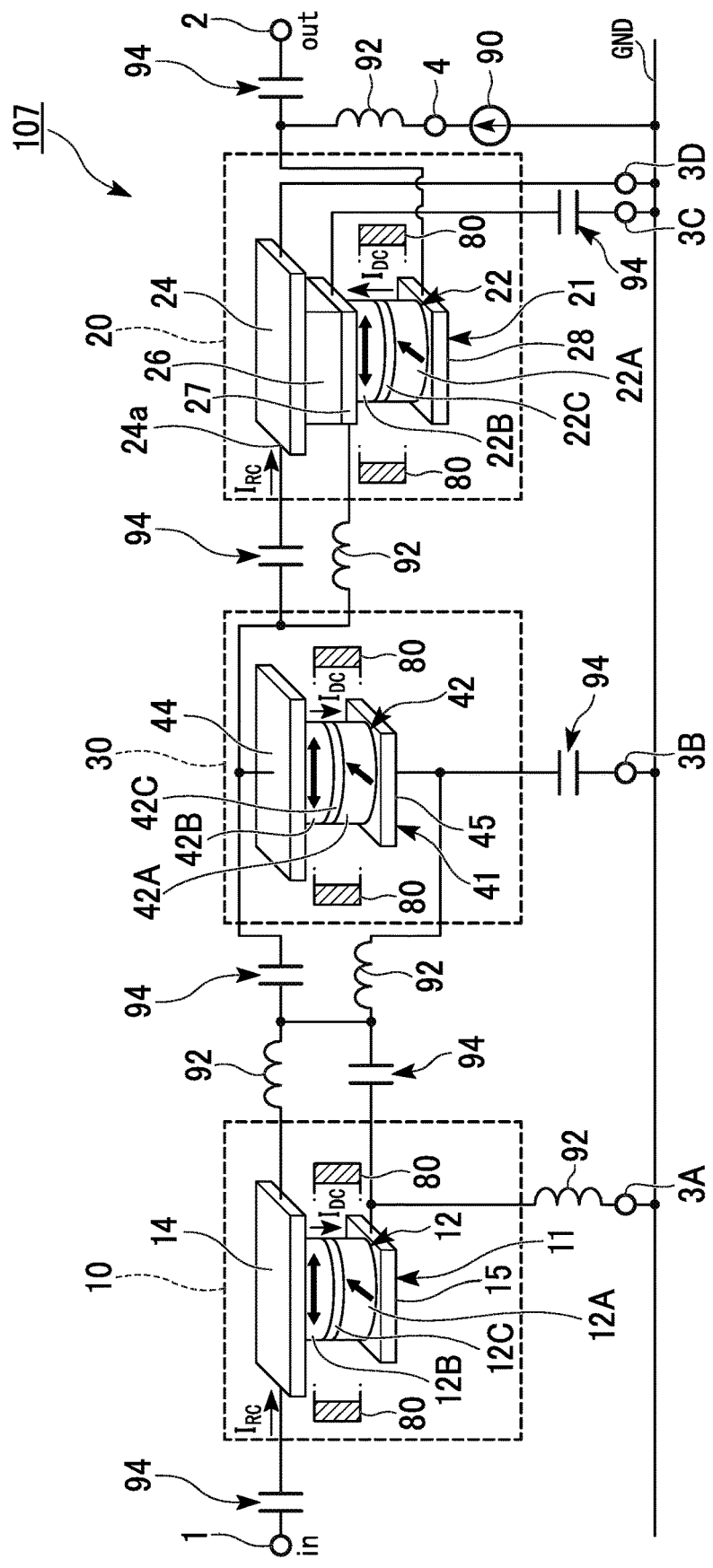
FIG. 12 is a schematic view showing a circuit configuration of another example of the magnetoresistance effect module according to the second embodiment.

In addition, in FIG. 9, while the DC application terminal 4 and the power supply 90 are connected to the first port 1 side that is the input side of the high frequency current $I_{RC}$, the DC application terminal 4 and the power supply 90 may be connected to the second port 2 side that is the output side of the high frequency current $I_{RC}$ like a magnetoresistance effect module 107 shown in FIG. 12. In FIG. 12, the reference electric potential terminal 3A is connected to the first circuit unit 10, the reference electric potential terminal 3B is connected (connected in an AC manner (in a high frequency manner)) to the third circuit unit 30 via the capacitor 94, the reference electric potential terminal 3C is connected (connected in an AC manner (in a high frequency manner)) to the second circuit unit 20 via the capacitor 94, and a reference electric potential terminal 3D is connected to the second circuit unit 20. In addition, in FIG. 12, the reference electric potential terminal 3A is connected (connected in a DC manner) to the third circuit unit 30 via the first circuit unit 10 and the inductor 92. In addition, in FIG. 12, the reference electric potential terminal 3A is connected (connected in a DC manner) to the second circuit unit 20 via the first circuit unit 10, the inductor 92 and the third circuit unit 30.

Figure 13:
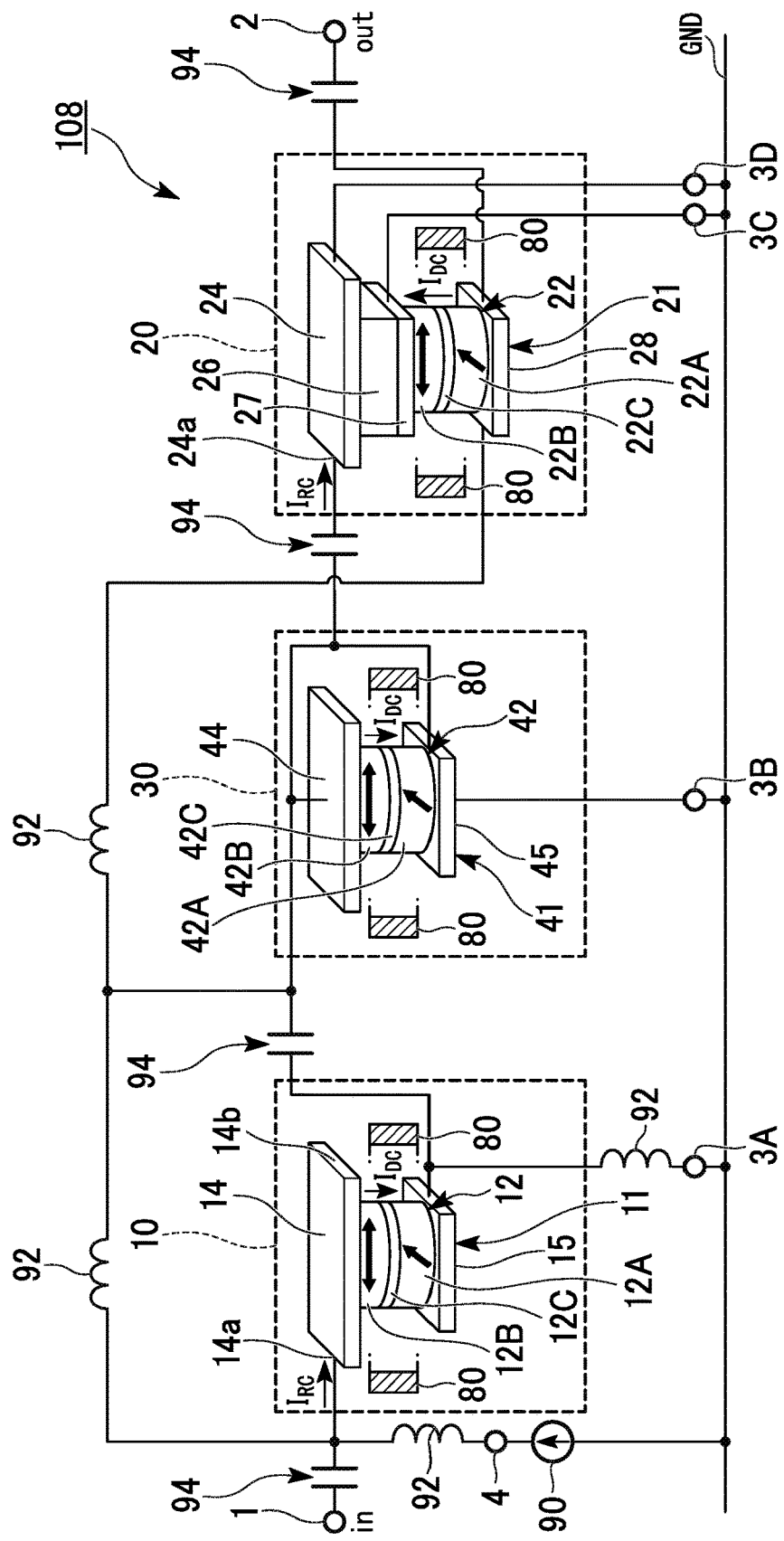
FIG. 13 is a schematic view showing a circuit configuration of another example of the magnetoresistance effect module according to the second embodiment.

In addition, in FIG. 9, the first magnetoresistance effect element 12, the second magnetoresistance effect element 22 and the fourth magnetoresistance effect element 42 have a serial positional relation with respect to the one power supply 90 (a flow direction of the DC current $I_{DC}$). On the other hand, like a magnetoresistance effect module 108 shown in FIG. 13, first magnetoresistance effect element 12, the second magnetoresistance effect element 22 and the fourth magnetoresistance effect element 42 may have a parallel positional relation with respect to the one power supply 90 (a flow direction of the DC current $I_{DC}$). In FIG. 13, the reference electric potential terminal 3A is connected to the first circuit unit 10, the reference electric potential terminal 3B is connected to the third circuit unit 30, and the reference electric potential terminals 3C and 3D are connected to the second circuit unit 20. In this case, since the same voltage is applied to the magnetoresistance effect elements, when the power supply 90 is a DC voltage source, control thereof becomes easy.

In addition, even in each connection state of the circuit unit shown in FIGS. 11A to 11H, the DC application terminal 4 and the power supply 90 can be shared by the magnetoresistance effect elements of the circuit units.

Further, a connection sequence of the first circuit unit 10, the second circuit unit 20 and the third circuit unit 30 connected between the first port 1 and the second port 2 may be an arbitrary sequence.

In addition, as a power supply configured to apply a DC current or a DC voltage to the magnetoresistance effect elements of the first circuit unit 10, the second circuit unit 20 and the third circuit unit 30, for example, independent power supplies may be provided in the units, respectively, power supplies shared by only two units may be provided, or a power supply shared by the three units may be provided.

As described above, according to the magnetoresistance effect module 106 of the embodiment, the signal characteristics of the magnetoresistance effect module 106 have a pass band that is advantageous for steepness characteristics on a low frequency side and a high frequency side.

Figure 14:
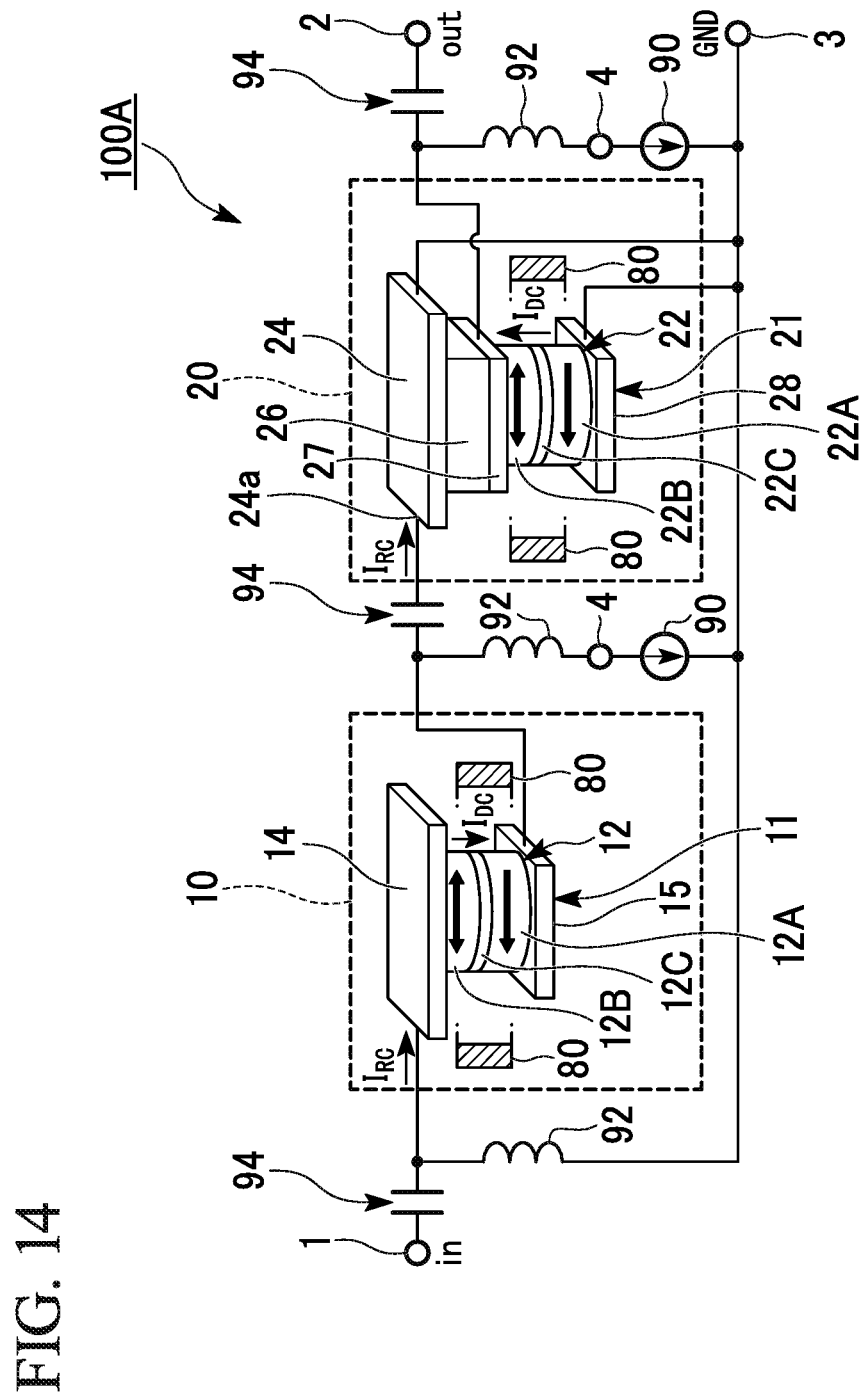
FIG. 14 is a schematic view showing a circuit configuration of a variant of the magnetoresistance effect module shown in FIG. 1.
Figure 15:
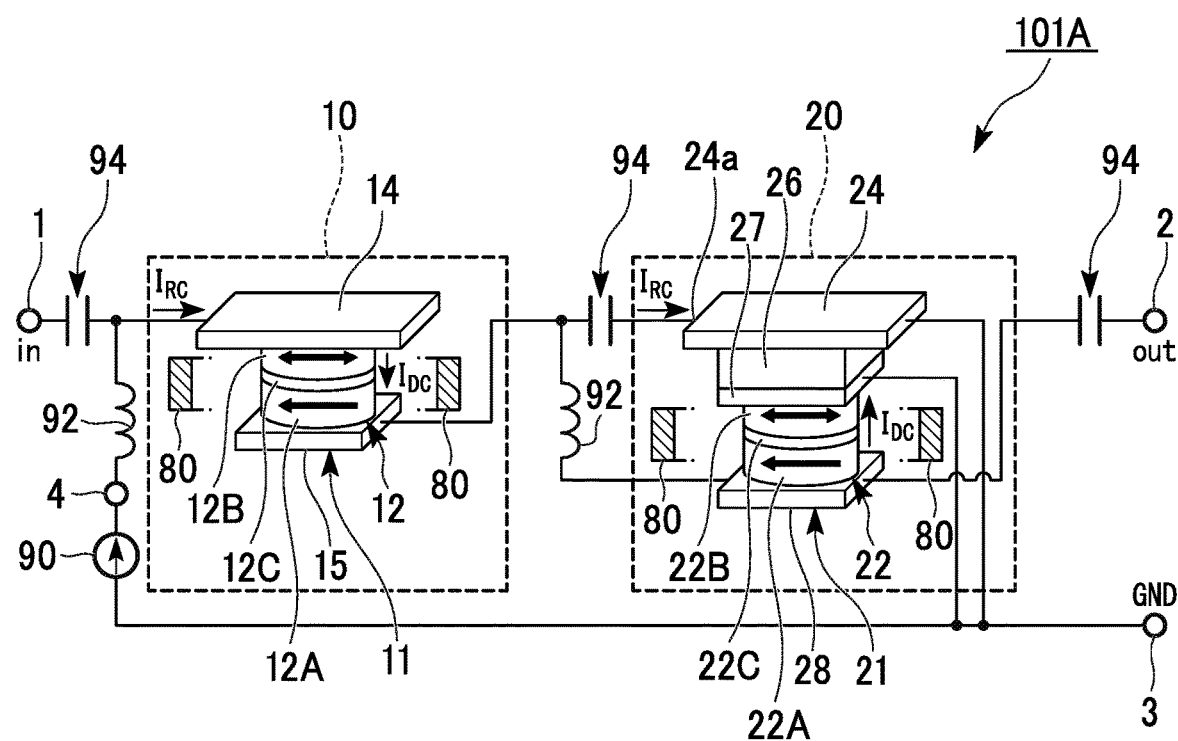
FIG. 15 is a schematic view showing a circuit configuration of a variant of the magnetoresistance effect module shown in FIG. 3.
Figure 16:
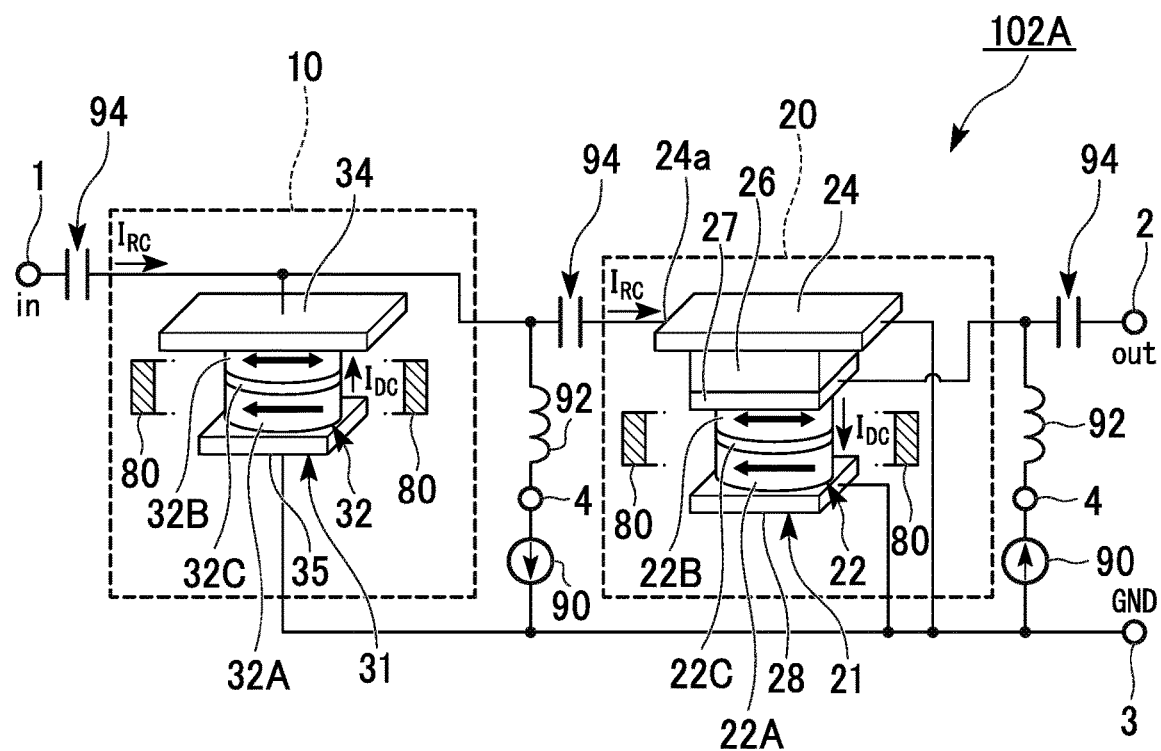
FIG. 16 is a schematic view showing a circuit configuration of a variant of the magnetoresistance effect module shown in FIG. 4.
Figure 17:
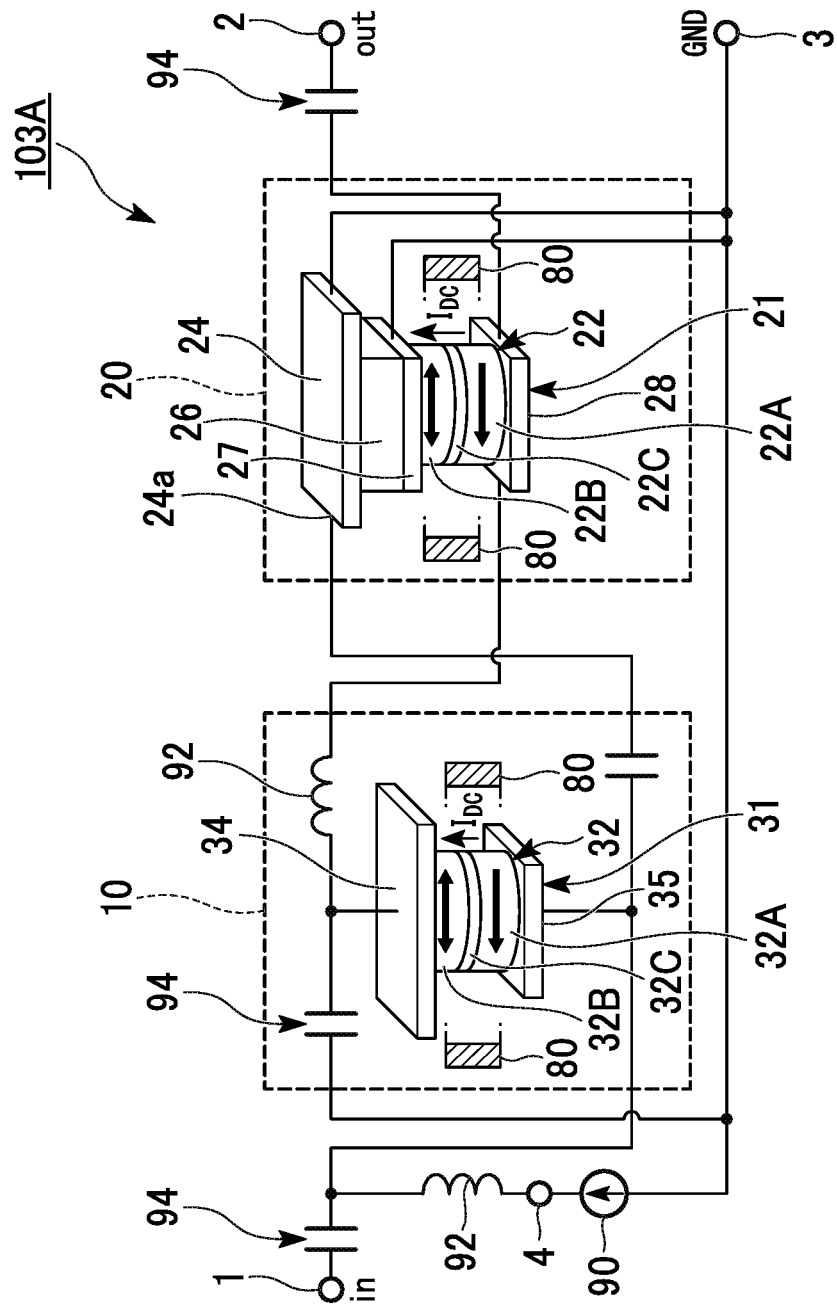
FIG. 17 is a schematic view showing a circuit configuration of a variant of the magnetoresistance effect module shown in FIG. 6.
Figure 18:
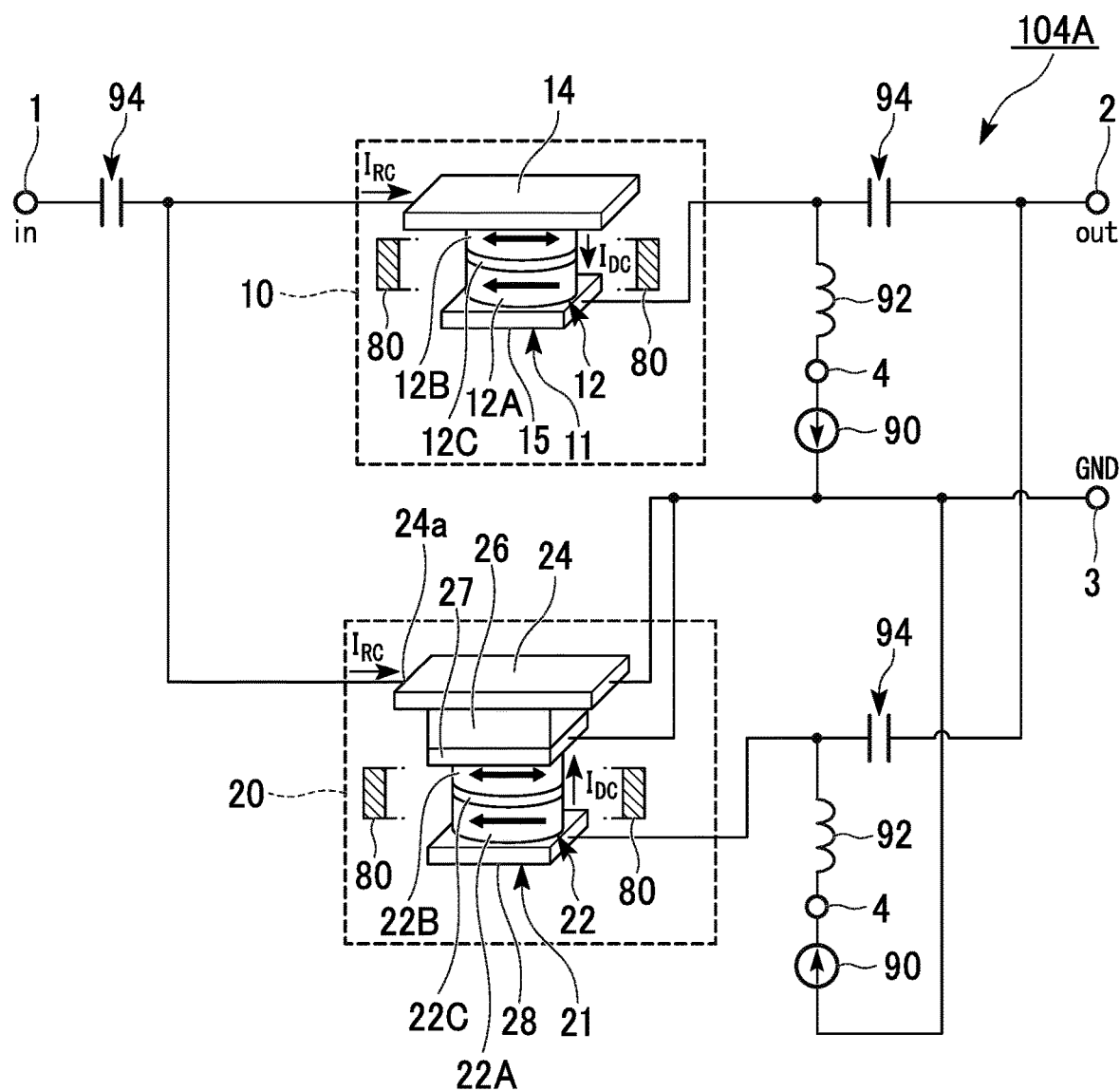
FIG. 18 is a schematic view showing a circuit configuration of a variant of the magnetoresistance effect module shown in FIG. 7.
Figure 19:
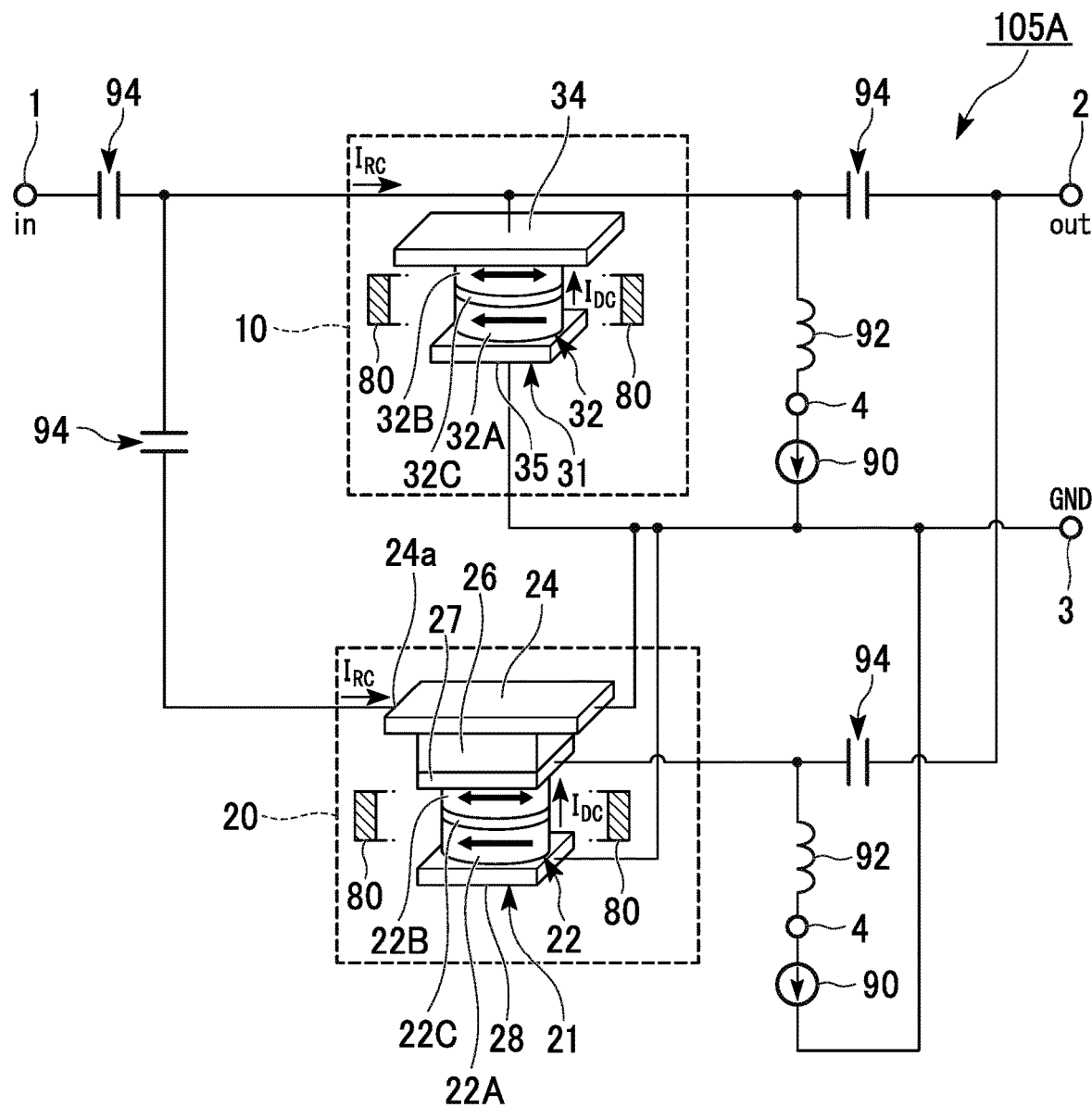
FIG. 19 is a schematic view showing a circuit configuration of a variant of the magnetoresistance effect module shown in FIG. 8.
Figure 20:
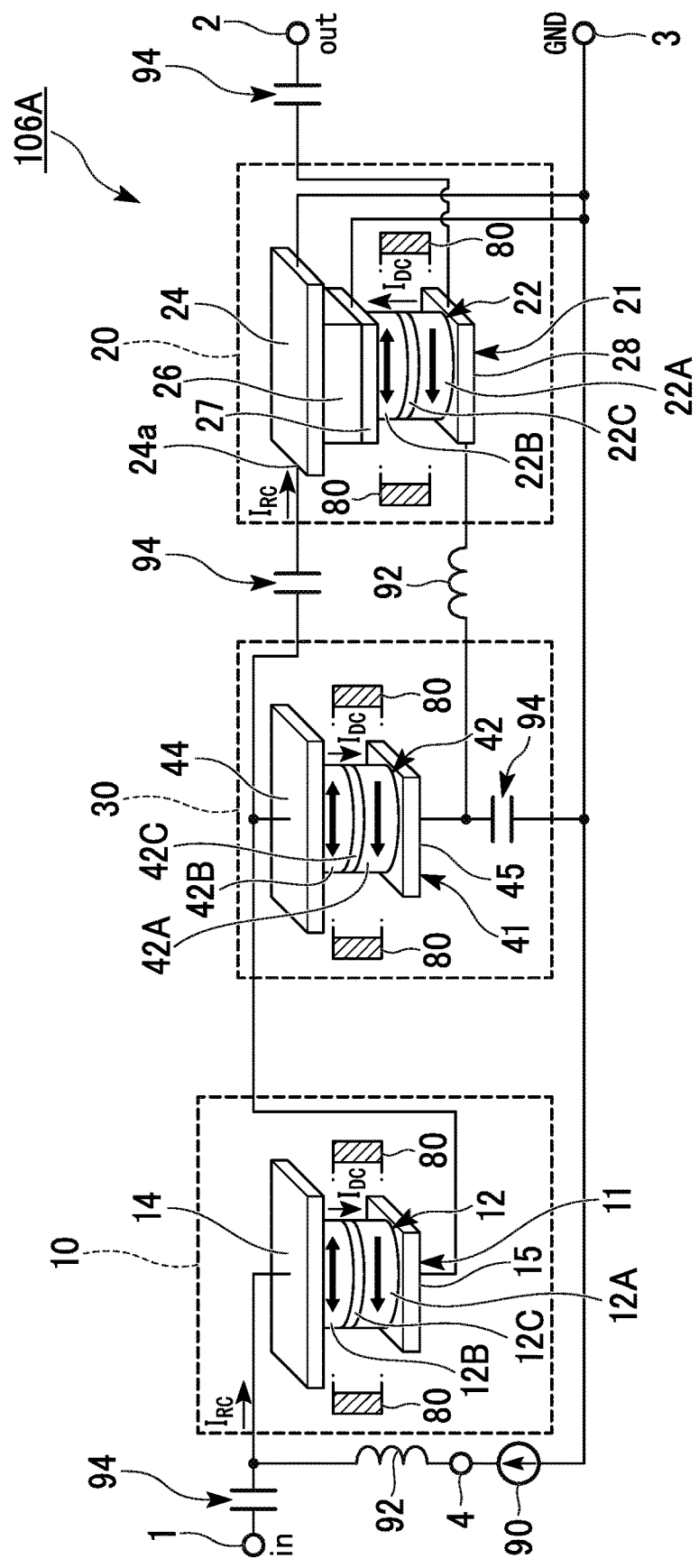
FIG. 20 is a schematic view showing a circuit configuration of a variant of the magnetoresistance effect module shown in FIG. 9.

In addition, FIG. 14 is a schematic view showing a circuit configuration of a variant of the magnetoresistance effect module 100 shown in FIG. 1. FIG. 15 is a schematic view showing a circuit configuration of a variant of the magnetoresistance effect module 101 shown in FIG. 3. FIG. 16 is a schematic view showing a circuit configuration of a variant of the magnetoresistance effect module 102 shown in FIG. 4. FIG. 17 is a schematic view showing a circuit configuration of a variant of the magnetoresistance effect module 103 shown in FIG. 6. FIG. 18 is a schematic view showing a circuit configuration of a variant of the magnetoresistance effect module 104 shown in FIG. 7. FIG. 19 is a schematic view showing a circuit configuration of a variant of the magnetoresistance effect module 105 shown in FIG. 8. FIG. 20 is a schematic view showing a circuit configuration of a variant of the magnetoresistance effect module 106 shown in FIG. 9. In the magnetoresistance effect modules 100A, 101A, 102A, 103A, 104A and 105A shown in FIGS. 14 to 19, a reference electric potential terminal 3 is integrated into a single unit for the first circuit unit 10 and the second circuit unit 20. In the magnetoresistance effect module 106A shown in FIG. 20, the reference electric potential terminal 3 is integrated into a single unit for the first circuit unit 10, the second circuit unit 20 and the third circuit unit 30. In addition, the power supply 90 is integrated into circuits of the magnetoresistance effect modules 100A, 101A, 102A, 103A, 104A, 105A and 106A. Even in the configurations of these variants, the magnetoresistance effect module has a pass band that is advantageous for steepness characteristics on a low frequency side and a high frequency side.

The inductor 92 according to the embodiment can be changed to a resistance element. The resistance element has a function of cutting a high frequency component of the current using a resistance component. The resistance element may be either a chip resistance or a resistance due to a pattern line. A resistance value of the resistance element is preferably a characteristic impedance or more of a signal line output from the magnetoresistance effect element. For example, when the characteristic impedance of the signal line is 50Ω and the resistance value of the resistance element is 50Ω, a high frequency power of 45% can be cut by the resistance element. In addition, when the characteristic impedance of the signal line is 50Ω and the resistance value of the resistance element is 500Ω, a high frequency power of 90% can be cut by the resistance element. Even in this case, the output signal output from the magnetoresistance effect element can efficiently flows to the second port 2.

In addition, in the embodiment, when the power supply 90 connected to the DC application terminal 4 has a function of allowing an unchangeable component of current to pass and cut a high frequency component of the current, the inductor 92 is not required. Even in this case, the output signal output from the magnetoresistance effect element can efficiently flow to the second port 2.

In addition, while the example in which the frequency setting mechanism 80 is used as the magnetic field applying mechanism has been described in the embodiment, another example described below may also be used in the frequency setting mechanism 80. For example, an electric field applying mechanism configured to apply an electric field to a magnetoresistance effect element may be used as a frequency setting mechanism. When an electric field applied to a magnetization free layer of the magnetoresistance effect element is varied by the electric field applying mechanism, an anisotropic magnetic field in the magnetization free layer is varied and an effective magnetic field in the magnetization free layer is varied. Then, a ferromagnetic resonance frequency of the magnetization free layer is set.

In addition, for example, a piezoelectric material and an electric field applying mechanism may be combined as a frequency setting mechanism. The piezoelectric material is provided in the vicinity of the magnetization free layer of the magnetoresistance effect element, and an electric field is applied to the piezoelectric material. The piezoelectric material to which the electric field is applied is deformed, and the magnetization free layer is distorted. When the magnetization free layer is distorted, the anisotropic magnetic field in the magnetization free layer is varied, and the effective magnetic field in the magnetization free layer is varied. Then, a ferromagnetic resonance frequency of the magnetization free layer is set.

In addition, for example, a control film that is an antiferromagnetic material or a ferrimagnetic material having an electromagnetic effect, a mechanism configured to apply a magnetic field to the control film, and a mechanism configured to apply an electric field to the control film may be used as the frequency setting mechanism. The electric field and the magnetic field are applied to the control film provided to magnetically couple to the magnetization free layer. When at least one of the electric field and the magnetic field applied to the control film is varied, an exchange coupling magnetic field in the magnetization free layer is varied, and an effective magnetic field in the magnetization free layer is varied. Then, a ferromagnetic resonance frequency of the magnetization free layer is set.

In addition, even when the frequency setting mechanism 80 is eliminated (a static magnetic field is not applied from the magnetic field applying mechanism), in the case in which the ferromagnetic resonance frequency of the magnetization free layer of the magnetoresistance effect element is a desired frequency, the frequency setting mechanism 80 may not be provided.

When the magnetic field applying mechanism is used as the frequency setting mechanism 80, if the mechanism is shared by and provided in the magnetoresistance effect elements, manufacturing costs are preferably reduced. In addition, external magnetic fields in the same directions as those of the magnetoresistance effect elements may also be applied from the magnetic field applying mechanism. Fixing directions of the magnetization of the magnetization fixed layers of the magnetoresistance effect element may be the same direction.

In addition, while the example in which the external magnetic field applied from the magnetic field applying mechanism has in-plane directional components of the magnetoresistance effect elements has been described, an angle formed between an in-plane directional component in a direction of the external magnetic field applied from the magnetic field applying mechanism to the magnetoresistance effect elements and an in-plane directional component in a fixing direction of magnetization of the magnetization fixed layer of the magnetoresistance effect element (hereinafter, referred to as a rotation angle) is preferably about 90°, may be an acute angle or may be an obtuse angle in that a variation amount of the resistance values of the magnetoresistance effect elements according to oscillation of the magnetization of the magnetization free layer of the magnetoresistance effect elements is increased. For example, in the first magnetoresistance effect element 12 and the fourth magnetoresistance effect element 42, both of rotation angles may be 90°, may be an acute angle or may be an obtuse angle. In addition, the rotation angle in the first magnetoresistance effect element 12 may be any one of the acute angle and the obtuse angle, and the rotation angle in the fourth magnetoresistance effect element 42 may be the other one of the acute angle and the obtuse angle. In addition, the rotation angle in the first magnetoresistance effect element 12 may be any one of the acute angle and the obtuse angle, and the rotation angle in the fourth magnetoresistance effect element 42 may be 90°. In addition, the rotation angle in the first magnetoresistance effect element 12 may be 90°, and the rotation angle in the fourth magnetoresistance effect element 42 may be any one of the acute angle and the obtuse angle.

In addition, the external magnetic field applied from the magnetic field applying mechanism may have laminating direction components of the magnetoresistance effect elements. An angle formed between a laminating direction component in a direction of the external magnetic field applied from the magnetic field applying mechanism to the magnetoresistance effect elements and an in-plane directional component (a film in-plane direction of the magnetization fixed layer) of a fixing direction of the magnetization of the magnetization fixed layer of the magnetoresistance effect element (hereinafter, referred to as an elevation angle) may be an acute angle or may be an obtuse angle. For example, in the first magnetoresistance effect element 12 and the fourth magnetoresistance effect element 42, both of the elevation angles may be acute angles or may be obtuse angles. In addition, the elevation angle in the first magnetoresistance effect element 12 may be any one of the acute angle and the obtuse angle, and the elevation angle in the fourth magnetoresistance effect element 42 may be the other one of the acute angle and the obtuse angle.

<Another Use>

In addition, as described above, while the case in which the magnetoresistance effect device is used as the high-frequency filter has been exemplarily provided, the magnetoresistance effect device may be used as a high frequency device such as an amplifier (amp) or the like.

In addition, when the magnetoresistance effect device is used as the amplifier, the DC current or the DC voltage applied from the power supply 90 has a predetermined magnitude or more. As described above, the signal output from the second port 2 is larger than the signal input from the first port 1, and functions as the amplifier.

As described above, the magnetoresistance effect device can function as a high frequency device such as an amplifier or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A magnetoresistance effect device comprising:
   a first port;
   a second port;
   a first circuit unit and a second circuit unit connected between the first port and the second port;

a shared reference electric potential terminal connected to both of the first circuit unit and the second circuit unit, or a first reference electric potential terminal and a second reference electric potential terminal, each of which is connected to the first circuit unit and the second circuit unit, respectively; and a shared DC application terminal configured to be capable of connecting a power supply for applying a DC current or a DC voltage to both of a first magnetoresistance effect element of the first circuit unit and a second magnetoresistance effect element of the second circuit unit, or a first DC application terminal and a second DC application terminal, each of which is configured to be capable of connecting a power supply for applying a DC current or a DC voltage to a first magnetoresistance effect element of the first circuit unit and a second magnetoresistance effect element of the second circuit unit, respectively, wherein the first circuit unit includes the first magnetoresistance effect element including a magnetization fixed layer, a magnetization free layer, and a spacer layer interposed therebetween, one end of the first magnetoresistance effect element is connected to an input side of a high frequency current in the first circuit unit, and the other end of the first magnetoresistance effect element is connected to an output side of the high frequency current in the first circuit unit, the second circuit unit includes the second magnetoresistance effect element including a magnetization fixed layer, a magnetization free layer, and a spacer layer interposed therebetween, and a first conductor disposed to be separated from the second magnetoresistance effect element with an insulating body therebetween and a first end portion of the first conductor is connected to an input side of a high frequency current such that a high frequency magnetic field generated by the high frequency current flowing through the first conductor is applied to the magnetization free layer of the second magnetoresistance effect element.

2. A magnetoresistance effect device comprising:
a first port;
a second port;
a first circuit unit and a second circuit unit connected between the first port and the second port;
a shared reference electric potential terminal connected to both of the first circuit unit and the second circuit unit, or a first reference electric potential terminal and a second reference electric potential terminal, each of which is connected to the first circuit unit and the second circuit unit, respectively; and
a shared DC application terminal configured to be capable of connecting a power supply for applying a DC current or a DC voltage to both of a third magnetoresistance effect element of the first circuit unit and a second magnetoresistance effect element of the second circuit unit, or a first DC application terminal and a second DC application terminal, each of which is configured to be capable of connecting a power supply for applying a DC current or a DC voltage to a third magnetoresistance effect element of the first circuit unit and a second magnetoresistance effect element of the second circuit unit, respectively, wherein the first circuit unit includes the third magnetoresistance effect element including a magnetization fixed layer, a magnetization free layer, and a spacer layer interposed therebetween, one end of the third magnetoresistance effect element is connected to an input side of a high frequency current and an output side of the high frequency current in the first circuit unit, and the other end of the third magnetoresistance effect element is connected to the shared reference electric potential terminal or the first reference electric potential terminal, the second circuit unit comprises the second magnetoresistance effect element including a magnetization fixed layer, a magnetization free layer, a spacer layer interposed therebetween, and a first conductor disposed to be separated from the second magnetoresistance effect element with an insulating body therebetween and a first end portion of the first conductor is connected to an input side of a high frequency current such that a high frequency magnetic field generated by the high frequency current flowing through the first conductor is applied to the magnetization free layer of the second magnetoresistance effect element.

3. The magnetoresistance effect device according to claim 1, further comprising a third circuit unit connected between the first port and the second port, wherein the third circuit unit includes a fourth magnetoresistance effect element including a magnetization fixed layer, a magnetization free layer, and a spacer layer interposed therebetween, the shared reference electric potential terminal is connected to the third circuit unit, the first reference electric potential terminal is connected to the third circuit unit, the second reference electric potential terminal is connected to the third circuit unit, or a third reference electric potential terminal, which is provided to the magnetoresistance effect device, is connected to the third circuit unit, the shared DC application terminal is configured to be capable of connecting the power supply for applying a DC current or a DC voltage to the fourth magnetoresistance effect element, the first DC application terminal is configured to be capable of connecting the power supply for applying a DC current or a DC voltage to the fourth magnetoresistance effect element, the second DC application terminal is configured to be capable of connecting the power supply for applying a DC current or a DC voltage to the fourth magnetoresistance effect element, or a third DC application terminal, which is provided to the magnetoresistance effect device, is configured to be capable of connecting a power supply for applying a DC current or a DC voltage to the fourth magnetoresistance effect element, and one end of the fourth magnetoresistance effect element is connected to an input side of a high frequency current and an output side of the high frequency current in the third circuit unit, the other end of the fourth magnetoresistance effect element is connected to the shared reference electric potential terminal, the first reference electric potential terminal, the second reference electric potential terminal or the third reference electric potential terminal.

4. A magnetoresistance effect module comprising:
the magnetoresistance effect device according to claim 1; and
a shared DC current source or a shared DC voltage source which is connected to the shared DC application terminal, or a first DC current source or a first DC voltage source and a second DC current source or a second DC voltage source, each of which is connected to the first DC application terminal and the second DC application terminal, respectively.

5. A magnetoresistance effect module comprising:

the magnetoresistance effect device according to claim 2; and a shared DC current source or a shared DC voltage source which is connected to the shared DC application terminal, or a first DC current source or a first DC voltage source and a second DC current source or a second DC voltage source, each of which is connected to the first DC application terminal and the second DC application terminal, respectively.

6. A magnetoresistance effect module comprising:

the magnetoresistance effect device according to claim 3; and a shared DC current source or a shared DC voltage source which is connected to the shared DC application terminal, or a first DC current source or a first DC voltage source, a second DC current source or a second DC voltage source and a third DC current source or a third DC voltage source, each of which is connected to the first DC application terminal, the second DC application terminal and the third DC application terminal, respectively.

* * * * *